United States Patent
Kim et al.

(10) Patent No.: US 12,310,217 B2
(45) Date of Patent: May 20, 2025

(54) COLOR CONVERSION SUBSTRATE INCLUDING FIRST BANK STRUCTURE SURROUNDING SECOND BANK STRUCTURE AND DISPLAY DEVICE INCLUDING THE SAME

(71) Applicant: Samsung Display Co., LTD., Yongin-si (KR)

(72) Inventors: Jeongki Kim, Hwaseong-si (KR); Jong-Hoon Kim, Seoul (KR); Jang-Il Kim, Asan-si (KR); Kyounghae Min, Asan-si (KR); Seongyeon Lee, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 435 days.

(21) Appl. No.: 17/842,726

(22) Filed: Jun. 16, 2022

(65) Prior Publication Data
US 2023/0076861 A1    Mar. 9, 2023

(30) Foreign Application Priority Data
Sep. 8, 2021    (KR) .................. 10-2021-0119802

(51) Int. Cl.
*H10K 59/38*    (2023.01)
*H10K 59/122*    (2023.01)

(52) U.S. Cl.
CPC .......... *H10K 59/38* (2023.02); *H10K 59/122* (2023.02)

(58) Field of Classification Search
CPC .......................... H10K 59/38; H10K 59/122
See application file for complete search history.

(56) References Cited

U.S. PATENT DOCUMENTS

| | | | |
|---|---|---|---|
| 2011/0260955 A1* | 10/2011 | Yoshida | H10K 59/122 345/76 |
| 2017/0123317 A1* | 5/2017 | Kamura | H01L 31/055 |
| 2021/0193968 A1* | 6/2021 | Lee | B29D 11/00365 |
| 2021/0376020 A1* | 12/2021 | Ahn | H10K 59/38 |
| 2022/0115470 A1* | 4/2022 | Kim | H01L 33/58 |
| 2022/0157891 A1* | 5/2022 | Zhao | H01L 33/58 |
| 2022/0317511 A1* | 10/2022 | Shi | G02F 1/133514 |

FOREIGN PATENT DOCUMENTS

| | | |
|---|---|---|
| JP | 2003-266010 | 9/2003 |
| JP | 2006-072176 | 3/2006 |
| KR | 10-0662781 | 1/2007 |

\* cited by examiner

*Primary Examiner* — Khiem D Nguyen
(74) *Attorney, Agent, or Firm* — KILE PARK REED & HOUTTEMAN PLLC

(57) ABSTRACT

A color conversion substrate includes a first bank structure, a second bank structure, a spacer, and a color conversion layer. The first bank structure includes a first partition wall that has a first opening area and a second opening area, and that divides the second opening area into a central area and a peripheral area that surrounds the central area. The second bank structure is spaced apart from the first partition wall and disposed in a central area of the second opening area. The spacer is disposed to overlap the second bank structure. The color conversion layer is disposed in the first opening area and includes a color conversion particle.

21 Claims, 19 Drawing Sheets

COLOR CONVERSION SUBSTRATE INCLUDING FIRST BANK STRUCTURE SURROUNDING SECOND BANK STRUCTURE AND DISPLAY DEVICE INCLUDING THE SAME

CROSS-REFERENCE TO RELATED APPLICATION

This application claims priority from and the benefit of Korean Patent Application No. 10-2021-0119802, filed on Sep. 8, 2021, which is hereby incorporated by reference for all purposes as if fully set forth herein.

BACKGROUND

Field

Embodiments of the invention relate generally to a display device. More particularly, embodiments relate to a color conversion substrate and the display device including the color conversion substrate.

Discussion of the Background

A flat panel display device is being used as a display device replacing a cathode ray and a display device due to characteristics such as light weight and thinness. Representative examples of such flat panel display devices are a liquid crystal display device ("LCD") and an organic light emitting display device ("OLED").

Recently, the organic light emitting device including an organic emission element and a color conversion layer has been studied. The color conversion layer may convert a wavelength of a light provided from an emission element. Accordingly, the organic light emitting display device may emit a light having a color different from a color of an incident light.

Ink may be applied through an inkjet process to form the color conversion layer. The ink may be applied between bank structures serving as well. However, when the color conversion layer is formed using the inkjet process, the ink may be erroneously applied on one or more of the bank structures. In this case, color mixing may occur. In addition, when a separate layer is disposed on the bank structure, a height of the separate layer is not uniform, so that a gap defect may occur in the organic light emitting display device.

The above information disclosed in this Background section is only for understanding of the background of the inventive concepts, and, therefore, it may contain information that does not constitute prior art.

SUMMARY

One or more embodiments provides a color conversion substrate that prevents erroneous application of ink.

One or more embodiments provides a display device including the color conversion substrate.

Additional features of the inventive concepts consistent with one or more of the embodiments described hereinbelow will be set forth in the description that follows, and in part will be apparent from the description, or may be learned by practice of the inventive concepts.

A color conversion substrate according to an embodiment may include a first bank structure that includes a first partition wall that has a first opening area and a second opening area and that divides the second opening area into a central area and a peripheral area that surrounds the central area, a second bank structure spaced apart from the first partition wall and disposed in the central area of the second opening area, a spacer disposed to overlap the second bank structure, and a color conversion layer disposed in the first opening area and including a color converting particle.

In an embodiment, the first bank structure may further include a plurality of second partition walls that extend from the first partition wall to an edge of the second opening area and that divide the peripheral area into a plurality of sub areas.

In an embodiment, each of the plurality of second partition walls may be perpendicular to the edge of the second opening area.

In an embodiment, the first bank structure and the second bank structure may include a same material.

In an embodiment, the first partition wall may have a polygonal planar shape including a plurality of vertices.

In an embodiment, the polygon may be any one of a quadrangle, a hexagon, and an octagon.

In an embodiment, a central portion of the second bank structure may coincide with a central portion of the central area.

In an embodiment, an area of the second opening area may be larger than an area of the first opening area.

In an embodiment, the second bank structure may divide the central area into a first central area and a second central area surrounding the first central area.

In an embodiment, the spacer may be disposed to overlap the first central area.

In an embodiment, the color conversion substrate may further include a connection pattern connecting the first bank structure and the second bank structure.

In an embodiment, the connection pattern may connect the first partition wall and the second bank structure. The connection pattern may be integrally formed with the first partition wall and the second bank structure.

In an embodiment, the color conversion substrate may further include a connection pattern connecting the first bank structure and the second bank structure. The second bank structure may divide the central area into a first central area and a second central area surrounding the first central area.

In an embodiment, the first opening area may include a first color conversion area, a second color conversion area, and a third color conversion area. The color conversion layer may include a first color conversion layer, a second color conversion layer, and a third color conversion layer disposed in the first color conversion area, the second color conversion area, and the third color conversion area, respectively.

In an embodiment, the first color conversion area and the third color conversion area may be repeatedly arranged in a first row. The second color conversion area may be repeatedly arranged in a second row. The first bank structure may further have a third opening area positioned adjacent to the second color conversion area and extending in a first direction and a fourth opening area positioned between the first color conversion area and the third color conversion area and extending in a second direction orthogonal to the first direction.

A display device according to an embodiment may include a first bank structure including a first partition wall having a first opening area and a second opening area and dividing the second opening area into a central area and a peripheral area that surrounds the central area, a second bank structure spaced apart from the first partition wall and disposed in the central area of the second opening area; a spacer disposed to overlap the second bank structure, a color conversion layer disposed in the first opening area and that includes a color converting particle, and an emission element disposed under the color conversion layer and that overlaps the first opening area.

In an embodiment, the first bank structure may further include a plurality of second partition walls that extend from the first partition wall to an edge of the second opening area and that divide the peripheral area into a plurality of sub areas.

In an embodiment, the first bank structure and the second bank structure may include a same material.

In an embodiment, a central portion of the second bank structure may coincide with a central portion of the central area.

In an embodiment, the first opening area may include a first color conversion area, a second color conversion area, and a third color conversion area. The color conversion layer may include a first color conversion layer, a second color conversion layer, and a third color conversion layer disposed in the first color conversion area, the second color conversion area, and the third color conversion area, respectively.

In an embodiment, the first color conversion area and the third color conversion area may be repeatedly arranged in a first row. The second color conversion area may be repeatedly arranged in a second row. The first bank structure may further have a third opening area positioned adjacent to the second color conversion area and extending in a first direction and a fourth opening area positioned between the first color conversion area and the third color conversion area and extending in a second direction orthogonal to the first direction.

In a color conversion substrate according to an embodiment, a first bank structure may have a first opening area and a second opening area. The second opening area may include a central area and a peripheral area that surrounds the central area. The second bank structure in which a spacer is disposed may be spaced apart from a first partition wall of the first bank structure and disposed in the central area of the second opening area. That is, the second bank structure may be disposed in a central portion of the central area most distant from the first opening area. Accordingly, in the inkjet process of forming the color conversion layer by applying an ink in the first opening area, the ink from being erroneously applied on the second bank structure may be prevented or reduced. Accordingly, an occurrence of color mixture may be minimized. In addition, a gap defect between the color conversion layer and an array substrate included in a display device may be prevented.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION OF THE EMBODIMENTS

Figure 1:
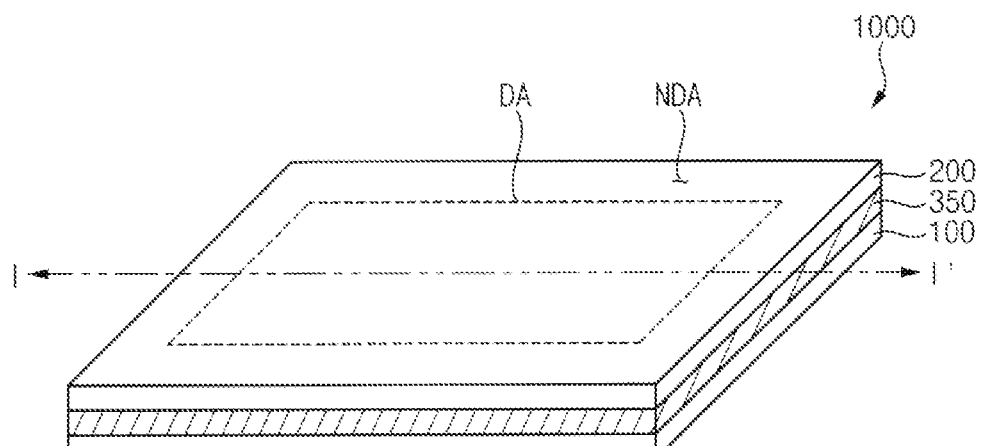
FIG. 1 is a perspective view illustrating a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the present disclosure will be explained in detail with reference to the accompanying drawings. The same reference numerals are used for the same components in the drawings, and redundant descriptions of the same components will be omitted for ease in explanation of the embodiments described hereinbelow.

Figure 2:
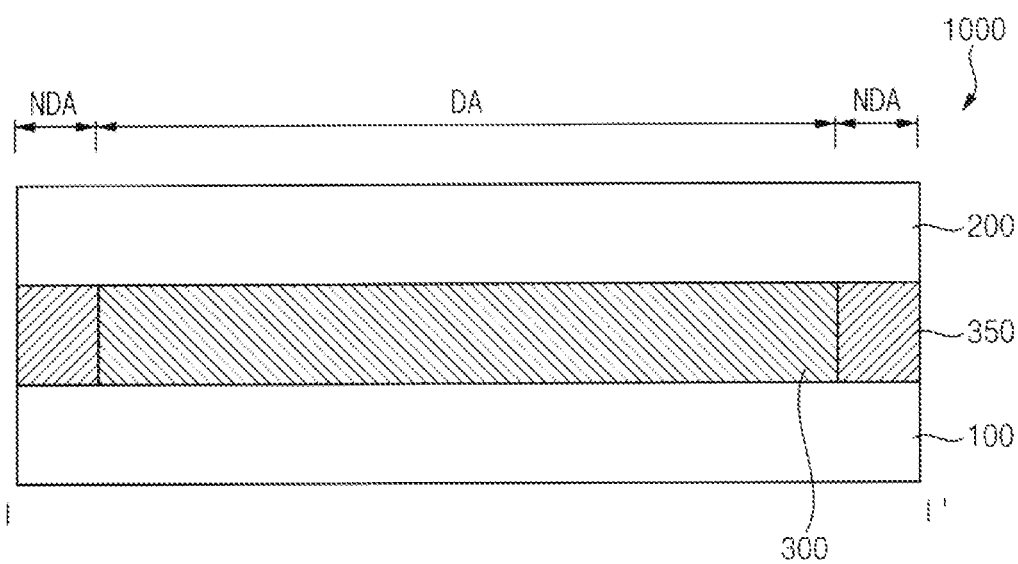
FIG. 2 is a cross-sectional view taken along line I-I' of FIG. 1.

FIG. 1 is a perspective view illustrating a display device according to an embodiment that is constructed according to principles of the invention. FIG. 2 is a cross-sectional view taken along line I-I' of FIG. 1.

FIGS. 1 and 2, the display device 1000 may include an array substrate 100, a sealing portion 350, a filling layer 300, and a color conversion substrate 200.

The display device 1000 may have a rectangular planar shape. For example, the display device 1000 may include two first sides extending in a first direction D1 and two second sides extending in a second direction D2 orthogonal to the first direction D1. An edge where the first side and the second side meet may be a right angle. In another embodiment, an edge where the first side and the second side of the display device 1000 meet may form a curved surface.

The display device 1000 may be divided into a display area DA and a non-display area NDA. The display area DA may display an image, and the non-display area NDA may not display an image. The non-display area NDA may be positioned around the display area DA. For example, the non-display area NDA may surround the display area DA.

The array substrate 100 may include a substrate, an insulating structure, an element for displaying an image, and the like. For example, the element may include a driving element, an emission element, and the like. A detailed description of the array substrate 100 will be described later.

The color conversion substrate 200 may be disposed on the array substrate 100. The color conversion substrate 200 may face the array substrate 100. The color conversion substrate 200 may include a color conversion layer that converts a wavelength of a light emitted from the emission element. A detailed description of the color conversion substrate 200 will be described later.

The sealing portion 350 may be disposed between the array substrate 100 and the color conversion substrate 200 in the non-display area NDA. The sealing portion 350 may be disposed along the edges of the array substrate 100 and the color conversion substrate 200 in the non-display area NDA to surround the display area DA on a plan view. In addition, the array substrate 100 and the color conversion substrate 200 may be coupled to each other through the sealing portion 350. The sealing portion 350 may include an organic material. For example, the sealing portion 350 may include an epoxy-based resin and the like.

The filling layer 300 may be disposed between the array substrate 100 and the color conversion substrate 200. The filling layer 300 may fill between the array substrate 100 and the color conversion substrate 200. The filling layer 300 may include a material capable of transmitting light. For example, the filling layer 300 may include an organic material. Examples of the material that can be used for the filling layer 300 may be a silicone-based resin, an epoxy-based resin, and the like. These may be used alone or in combination with each other. In another embodiment, the filling layer 300 may be omitted.

However, although the display device 1000 of the embodiments described herein is limited to an organic light emitting display device ("OLED"), the configuration of the embodiments described herein is not limited thereto. In other embodiments, the display device 1000 may include a liquid crystal display device ("LCD"), a field emission display device ("FED"), a plasma display device ("PDP"), or an electrophoretic display device ("EPD"). Hereinafter, an example in which the display device 1000 according to one or more embodiments described herein includes the organic light emitting display device will be described.

Figure 3:
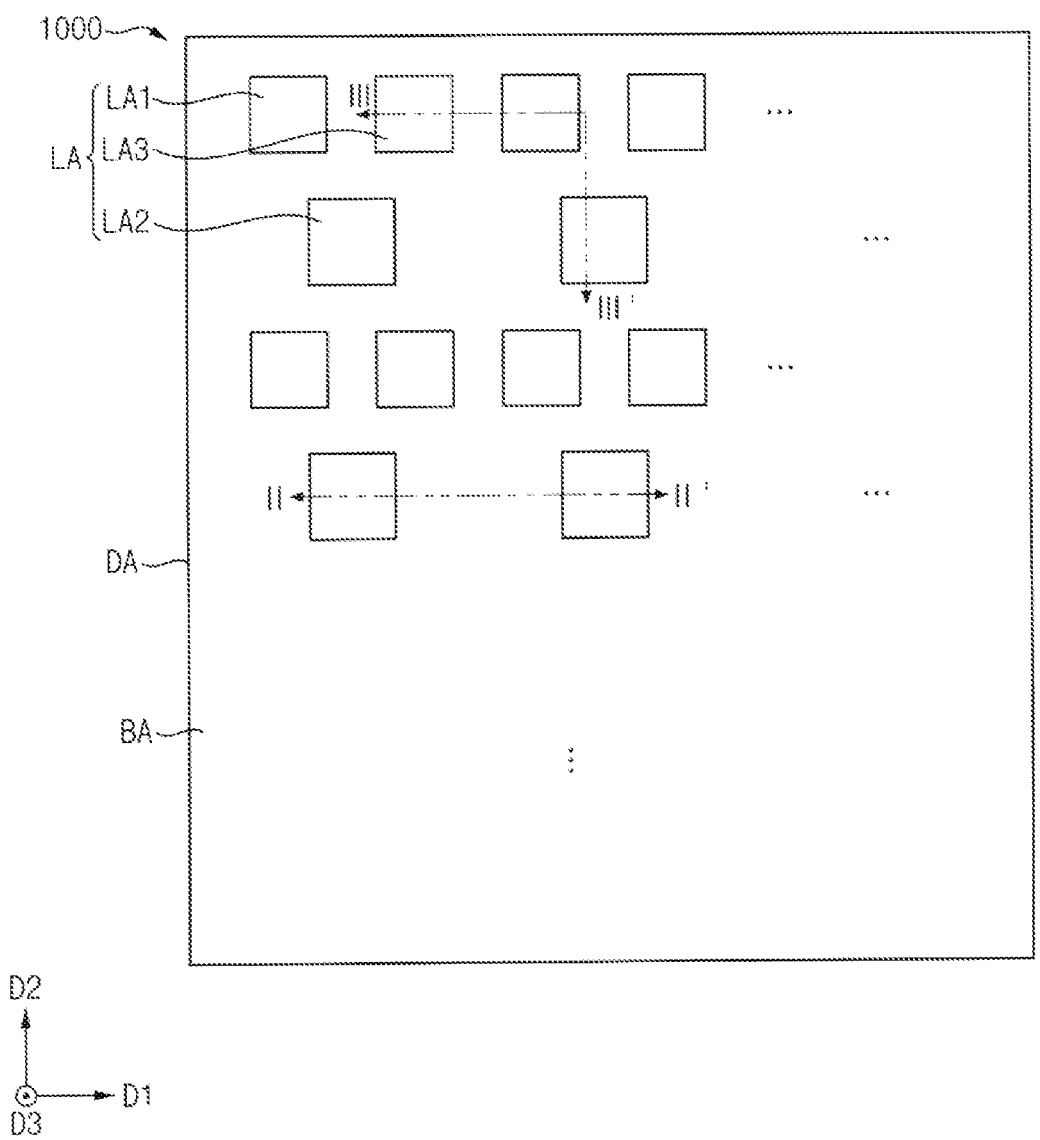
FIG. 3 is a plan view illustrating the display device of FIGS. 1 and 2.

FIG. 3 is a plan view illustrating the display device of FIGS. 1 and 2.

Referring to FIG. 3, the display area DA of the display device 1000 may include an emission area LA and a light blocking area BA. Here, the emission area LA may include a first emission area LA1, a second emission area LA2, and a third emission area LA3.

Each of the first, second, and third emission areas LA1, LA2, and LA3 may be an area in which light emitted from the emission element is emitted to an outside of the display device 1000. Specifically, the first emission area LA1 may emit a first light, the second emission area LA2 may emit a second light, and the third emission area LA3 may emit a third light. For example, the first light may be a red light, the second light may be a green light, and the third light may be a blue light.

Each of the first, second, and third emission areas LA1, LA2, and LA3 may be repeatedly arranged along a row direction and a column direction in a plan view. Specifically, each of the first, second, and third emission areas LA1, LA2, and LA3 may be repeatedly arranged along the first direction D1 and the second direction D2 orthogonal to the first direction D1 in a plan view. In an embodiment, the first emission area LA1 and the third emission area LA3 may be repeatedly arranged in a first row of the display area DA. The second emission area LA2 may be repeatedly arranged in a second row of the display area DA in a plan view.

Areas of the first, second, and third emission areas LA1, LA2, and LA3 may be different from each other. In an embodiment, the area of the first emission area LA1 and the area of the third emission area LA3 may be the same, and the area of the second emission area LA2 may be larger than the area of each of the first and third emission areas LA1 and LA3. In another embodiment, the area of the second emission area LA2 may be larger than the area of the first emission area LA1, and the area of the first emission area LA1 may be larger than the area of the third emission area LA3.

Each of the first, second, and third emission areas LA1, LA2, and LA3 may have a triangular planar shape, a quadrangle planar shape, a circular planar shape, a track-type planar shape, an elliptical planar shape, and the like. In an embodiment, each of the first, second, and third emission areas LA1, LA2, and LA3 may have the quadrangle planar shape.

The light blocking area BA may be positioned between the first emission area LA1, the second emission area LA2, and the third emission area LA3. For example, the light blocking area BA may surround the first emission area LA1, the second emission area LA2, and the third emission area LA3 in a plan view. The light blocking area BA may not emit light.

FIGS. 1, 4, 5, 6 and 7, the display device 1000 may include the array substrate 100, the sealing portion 350, the filling layer 300, and the color conversion substrate 200. First, the color conversion substrate 200 will be described.

The color conversion substrate 200 may include an upper substrate 210, a color filter layer 220, a low refractive index layer 230, a protective layer 240, a color conversion layer 260, a first bank structure 250a, a second bank structure 250b and a spacer 270.

The color conversion substrate 200 may be disposed on the array substrate 100. The color conversion substrate 200 and the array substrate 100 may be coupled.

The upper substrate 210 may transmit light emitted from an emission element 150. For example, the upper substrate 210 may be formed of a transparent resin substrate. The upper substrate 210 may include an insulating material such as glass or plastic. Alternatively, the upper substrate 210 may include an organic polymer material such as polycarbonate ("PC"), polyethylene ("PE"), or polypropylene ("PP"), and the like.

The color filter layer 220 may be disposed under the upper substrate 210. The color filter layer 220 may selectively transmit light having a specific wavelength. The color filter layer 220 may include a first color filter layer 221, a second color filter layer 222, and a third color filter layer 223. The first color filter layer 221 may selectively transmit light having a first wavelength (e.g., red light). The second color filter layer 222 may selectively transmit light having a second wavelength (e.g., green light). The third color filter layer 223 may selectively transmit light having a third wavelength (e.g., blue light).

A light blocking layer may be disposed under the upper substrate 210. The light blocking layer may overlap the light blocking area BA. Light emitted from the emission element 150 may pass through only a partial area of the color conversion substrate 200. That is, light emitted from the emission element 150 may transmit only an area of the color conversion substrate 200 overlapping the first, second, and third emission areas LA1, LA2, and LA3, and may not transmit an area of the color conversion substrate 200 overlapping the light blocking area BA. In an embodiment, the light blocking layer may be formed by overlapping the first, second, and third color filter layers 221, 222, and 223.

In an embodiment, the light blocking layer may include a light blocking material. For example, the light blocking material may have a specific color.

The low refractive index layer 230 may be disposed under the color filter layer 220. The low refractive index layer 230 may cover the color filter layer 220. The low refractive index layer 230 may have a relatively low refractive index. For example, a refractive index of the low refractive index layer 230 may be lower than a refractive index of the color conversion layer 260. The low refractive index layer 230 may include an organic material. For example, the low refractive index layer 230 may include an organic polymer material including silicon.

The protective layer 240 may be disposed under the low refractive index layer 230. The protective layer 240 may cover the low refractive index layer 230. The protective layer 240 may block external impurities to prevent contamination of the color filter layer 220. The protective layer 240 may include an inorganic material. For example, the protective layer 240 may include silicon oxide, silicon nitride, aluminum nitride, and the like.

The first bank structure 250a and the second bank structure 250b may be disposed under the protective layer 240. Each of the first bank structure 250a and the second bank structure 250b may overlap the light blocking area BA.

The first bank structure 250a may block light (e.g., red light) emitted from a first color conversion layer 261 from being irradiated to a second color conversion layer 262 or a transmission layer 263, or light (e.g., green light) emitted from a second color conversion layer 262 from being irradiated to the first color conversion layer 261 or the transmission layer 263, or light (e.g., blue light) emitted from the transmission layer 263 from being irradiated to the first color conversion layer 261 or the second color conversion layer 262.

The first bank structure 250a may have a first opening area OP1 and a second opening area OP2. The first opening area OP1 may include first, second, and third color conversion areas CA1, CA2, and CA3. Each of the first color conversion layer 261, the second color conversion layer 262, and the transmission layer 263 may be formed in each of the first, second, and third color conversion areas CA1, CA2, and CA3 by an inkjet method.

Here, the first opening area OP1 may denote an area in the first bank structure 250a filled with a material of the color conversion layer 260. The second opening area OP2 may denote an area in the first bank structure 250a filled with a material of the filling layer 300. That is, each of the first opening area OP1 and the second opening area OP2 may denote an area in which a portion of the protective layer 240 is in contact with a different configuration (e.g., the color conversion layer 260, the filling layer 300, and the like) other than the first bank structure 250a.

The second bank structure 250b may be disposed in the second opening area OP2. The spacer 270 may be disposed under the second bank structure 250b. Specifically, the spacer 270 may be disposed to overlap the second bank structure 250b. The spacer 270 may serve to maintain a gap between the color conversion substrate 200 and the array substrate 100. In addition, the spacer 270 may serve to constantly maintain the gap. For example, the spacer 270 may include an organic material.

The color conversion layer 260 may be disposed under the protective layer 240. The color conversion layer 260 may convert light emitted from the emission element 150 into light having a specific wavelength. For example, the color conversion layer 260 may include a color conversion particle.

The color conversion layer 260 may include the first color conversion layer 261, the second color conversion layer 262, and the transmission layer 263. Specifically, the first color conversion layer 261 may be disposed in the first color conversion area CA1, the second color conversion layer 262 may be disposed in the second color conversion area CA2, and the transmission layer 263 may be disposed in the third color conversion area CA3.

The first color conversion layer 261 may convert light emitted from the emission element 150 into light of a first color (e.g., red light). The second color conversion layer 262 may convert light emitted from the emission element 150 into light of a second color (e.g., green light). The transmission layer 263 may transmit light emitted from the emission element 150. In an embodiment, the light may be a blue light. However, the configuration of the embodiments described herein is not limited thereto, and the light may denote light of another color such as a white light.

The first color conversion layer 261 may include first color conversion particles that are excited by the light generated from the emission element 150 to emit light of a first color. The first color conversion layer 261 may further include a first photosensitive polymer in which first scattering particles are dispersed.

The second color conversion layer 262 may include second color conversion particles that are excited by the light generated from the emission element 150 to emit light of a second color. The second color conversion layer 262 may further include a second photosensitive polymer in which second scattering particles are dispersed. Each of the first color conversion particle and the second color conversion particle may denote a quantum dot.

The transmission layer 263 may transmit the light generated from the emission element 150 and emit the light toward the upper substrate 210. The transmission layer 263 may include a third photosensitive polymer in which third scattering particles are dispersed. For example, each of the first, second, and third photosensitive polymers may include an organic material having light transmittance, such as a silicone resin, an epoxy resin, and the like. The first, second, and third photosensitive polymers may include the same material. The first, second, and third scattering particles may scatter and emit light generated from the emission element 150. The first, second, and third scattering particles may include the same material.

Figure 4:
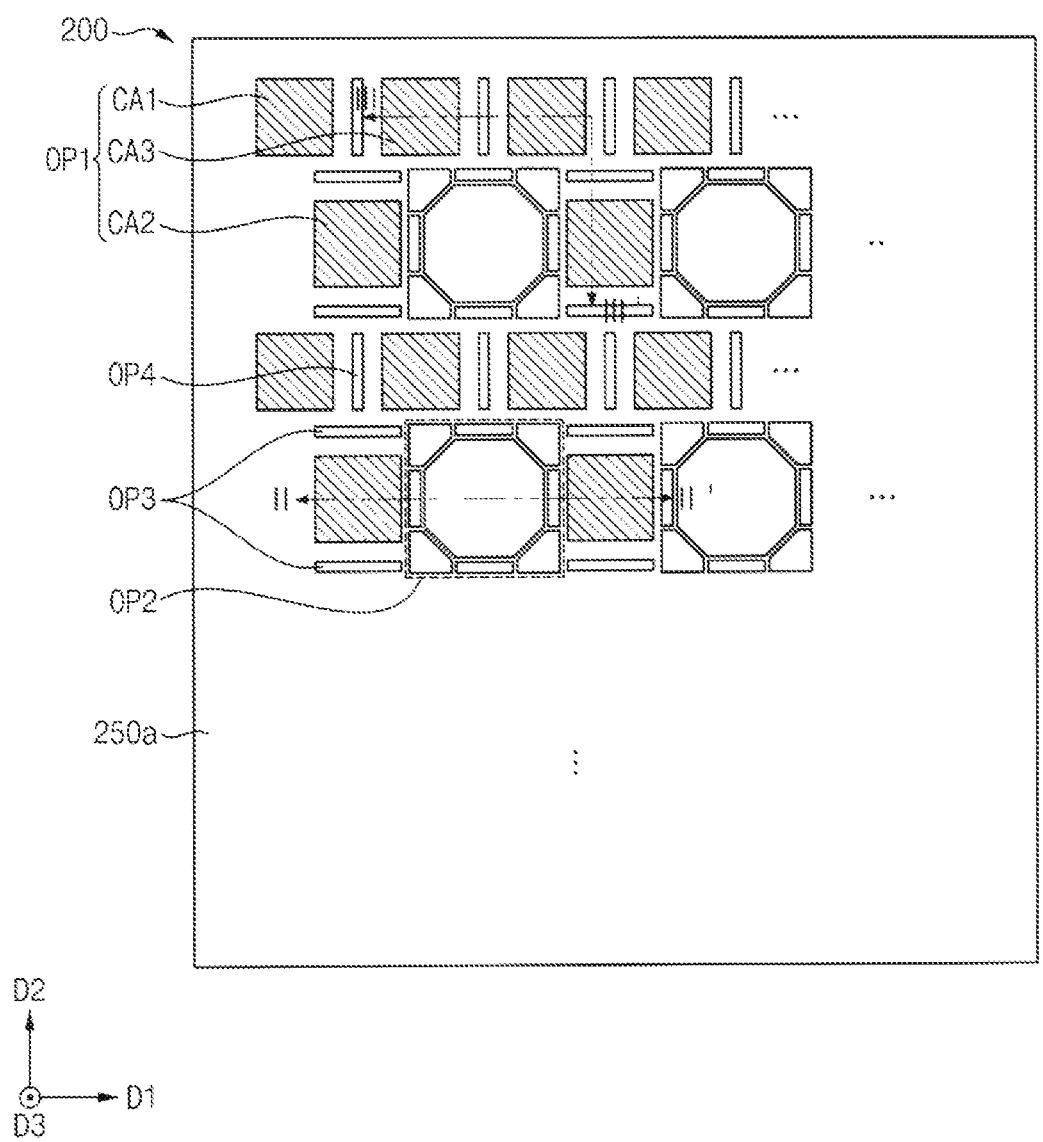
FIG. 4 is a plan view illustrating a color conversion substrate of FIGS. 1 and 2.

Referring to FIGS. 3 and 4, in an embodiment, as the color conversion substrate 200 includes the first opening area OP1 and the second opening area OP2, the first bank structure 250a may have the first opening area OP1 and the second opening rea OP2. The first opening area OP1 may include the first, second, and third color conversion areas CA1, CA2, and CA3. Each of the first, second, and third color conversion areas CA1, CA2, and CA3 may correspond to each of the first, second, and third emission areas LA1, LA2, and LA3. The second opening area OP2 may overlap at least a portion of the light blocking area BA.

Each of the first, second, and third color conversion areas CA1, CA2, and CA3 may be repeatedly arranged along the row direction and the column direction in the plan view. Specifically, on a plane, each of the first to third color conversion areas CA1, CA2, and CA3 may be repeatedly arranged along the first direction D1 and the second direction D2 orthogonal to the first direction D1 in the plan view. In an embodiment, the first and third color conversion areas CA1 and CA3 may be repeatedly arranged in a first row and a third row, and the second color conversion area CA2 may be repeatedly arranged in a second row and a fourth row in the plan view.

The second opening area OP2 may be repeatedly arranged in the row direction and the column direction in the plan view. Specifically, the second opening area OP2 may be repeatedly arranged in the first direction D1 and in the second direction D2 orthogonal to the first direction D1. In an embodiment, the second opening area OP2 may be repeatedly arranged in the second row and the fourth row with a second color conversion area CA2 interposed therebetween.

Each of the first and second opening areas OP1 and OP2 may have a triangular planar shape, a quadrangle planar shape, a circular planar shape, a track-type planar shape, an oval planar shape, and the like. In an embodiment, each of the first and second opening areas OP1 and OP2 may have the quadrangle planar shape.

In an embodiment, an area of the second opening area OP2 may be larger than an area of the first opening area OP1. That is, the area of the second opening area OP2 may be larger than the area of each of the first, second, and third color conversion areas CA1, CA2, and CA3.

In an embodiment, the first bank structure 250a may further have a third opening area OP3 and a fourth opening area OP4. The third opening area OP3 may extend in the first direction D1. The fourth opening area OP4 may extend in a second direction D2 orthogonal to the first direction D1.

Here, each of the third opening area OP3 and the fourth opening area OP4 may denote an area of the first bank structure 250a filled with a material of the filling layer 300. That is, each of the third opening area OP3 and the fourth opening area OP4 may denote an area in which a portion of the protective layer 240 is in contact with a different configuration (e.g., the filling portion 300 and the like) other than the first bank structure 250a.

The third opening area OP3 may be positioned adjacent to the second color conversion area CA2. The fourth opening area OP4 may be positioned between the first color conversion area CA1 and the third color conversion area CA3. For example, the third opening area OP3 may be repeatedly arranged along the second direction D2 with the third color conversion area CA3 interposed therebetween, and the fourth opening area OP4 may be repeatedly arranged along the first direction D1.

The third opening area OP3 may prevent the second color conversion layer 262 disposed in the second color conversion area CA2 from being lost to the adjacent first and third color conversion areas CA1 and CA3. In addition, the third opening area OP3 may prevent the first color conversion layer 261 and the transmission layer 263 respectively disposed in the first and third color conversion areas CA1 and CA3 from being lost to the adjacent the second color conversion area CA2.

The fourth opening area OP4 may prevent the first color conversion layer 261 disposed in the first color conversion area CA1 from being lost to the adjacent third color conversion area CA3. In addition, the fourth opening area OP4 may prevent the transmission layer 263 disposed in the third color conversion area CA3 from being lost to the adjacent first color conversion area CA1.

Figure 5:
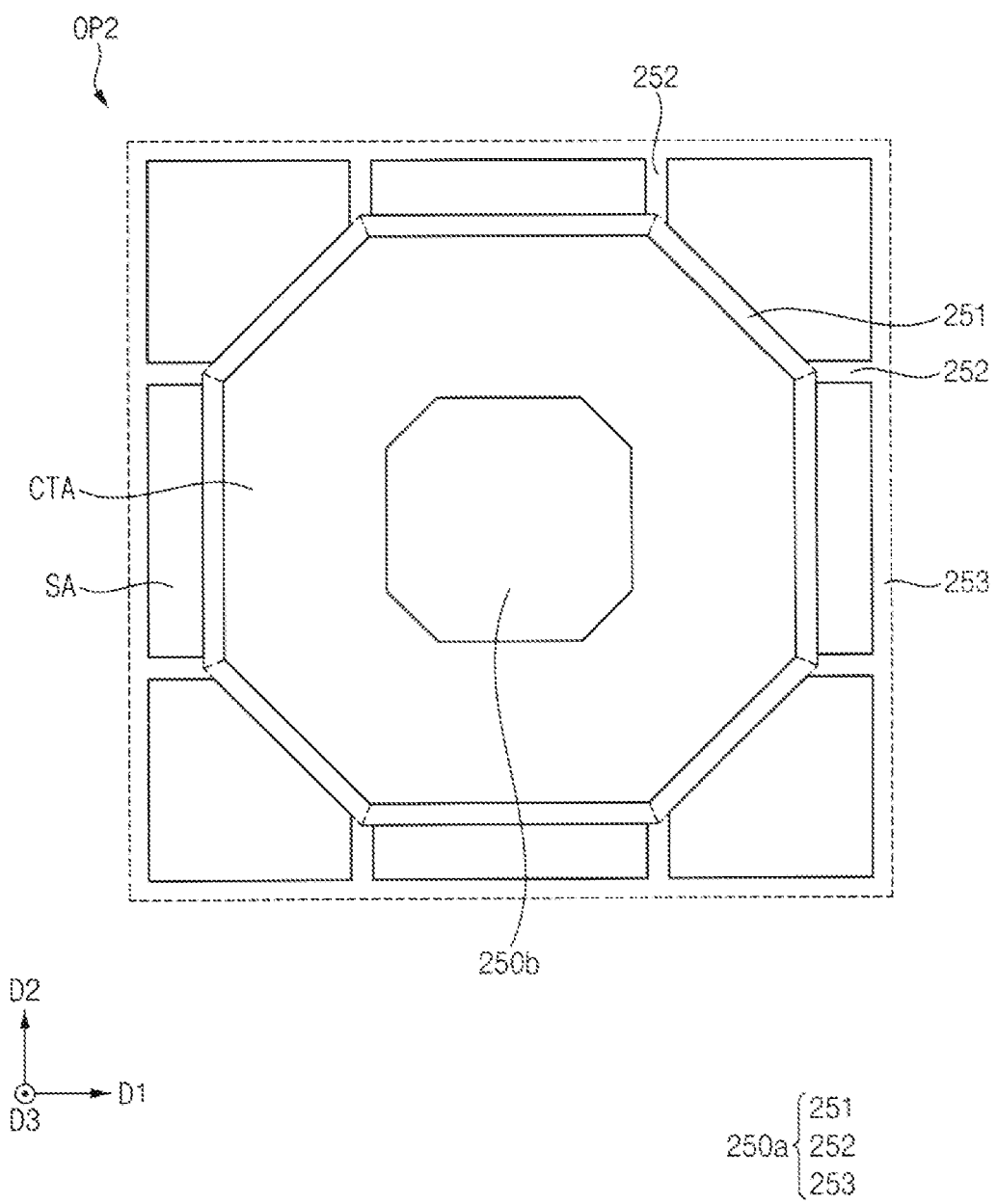
FIG. 5 is an enlarged plan view of a second opening area of FIG. 4.

Referring to FIG. 5, the first bank structure 250a may include a first partition wall 251, second partition walls 252, and a third partition wall 253. The first, second, and third partition walls 251, 252, and 253 may be integrally formed. That is, the first, second, and third partition walls 251, 252, and 253 may include the same material.

The second opening area OP2 may be divided by the first partition wall 251 and the second partition walls 252. The first partition wall 251 may divide the second opening area OP2 into a central area CTA and a peripheral area SA. The peripheral area SA may surround the central area CTA. For example, the central area CTA may denote an area surrounded by the first partition wall 251, and the peripheral area SA may denote an area outside the area surrounded by the first partition wall 251. The central area CTA and the peripheral area SA may receive an ink that is applied from an inkjet apparatus.

The first partition wall 251 may have a polygonal planar shape including a plurality of vertices. Accordingly, the central area CTA may have a polygonal planar shape. In an embodiment, the first partition wall 251 may have an octagonal planar shape including eight vertices. However, the configuration of the embodiments described herein are not limited thereto, and the first partition wall 251 may have a quadrangle planar shape including four vertices or a hexagonal planar shape including six vertices.

The second partition walls 252 may extend from each of the vertices of the first partition wall 251 to the edge of the second opening area OP2. In addition, the second partition walls 252 may divide the peripheral area SA into a plurality of sub areas. In an embodiment, the second partition walls 252 may divide the peripheral area SA into eight sub areas. However, the configuration of the embodiments described herein are not limited thereto, and the second partition walls 252 may divide the peripheral area SA into four or six sub areas.

Each of the second partition walls 252 may be perpendicular from the edge of the second opening area OP2. The third partition wall 253 may denote a portion other than the first partition wall 251 and the second partition walls 252.

In an embodiment, the second bank structure 250b may be disposed in the central area CTA of the second opening area OP2 to be spaced apart from the first partition wall 251. That is, the second bank structure 250b may be disposed in a portion of the central area CTA that is farthest from the first opening area OP1. Specifically, a central portion of the second bank structure 250b may coincide with a central portion of the central area CTA. The second bank structure 250b may be separated from the first bank structure 250a. The second bank structure 250b may be simultaneously formed using the same material as the first bank structure 250a.

The second bank structure 250b may have a polygonal planar shape, a circular planar shape, and the like. For example, a planar shape of the second bank structure 250b may be the same as a planar shape of the first bank structure 250a. In this case, the second bank structure 250b may have an octagonal planar shape. However, the configuration of the embodiments described herein are not limited thereto, and the second bank structure 250b may have a rectangular planar shape or a hexagonal planar shape.

In a conventional color conversion substrate, a second bank structure on which a spacer is disposed is integrally formed with a first bank structure. That is, the second bank structure is connected to the first bank structure. In this case, in the inkjet process, an ink may be erroneously applied on the second bank structure. In this case, a gap defect may occur between the color conversion substrate and an array substrate included in a display device.

In the color conversion substrate 200 according to an embodiment, the first bank structure 250a may have the first opening area OP1 and the second opening area OP2. The second opening area OP2 may include the central area CTA and the peripheral area SA surrounding the central area CTA. The second bank structure 250b on which the spacer 270 is disposed may be spaced apart from the first partition wall 251 of the first bank structure 250a and disposed in the central area CTA of the second opening area OP2. That is, the second bank structure 250b may be disposed in a central portion of the central area CTA that is farthest from the first opening area OP1. Accordingly, in the inkjet process of forming the color conversion layer 260 by applying an ink in the first opening area OP1, an ink from being erroneously applied on the second bank structure 250b may be prevented or reduced. An ink that is erroneously applied may be accommodated in the second opening area OP2. Accordingly, an occurrence of color mixing caused by the overlapping of the ink that is erroneously applied may be minimized. In addition, a gap defect between the color conversion substrate 200 and the array substrate 100 included in the display device 1000 may be prevented.

Hereinafter, the array substrate 100 will be described.

Referring back to FIGS. 6 and 7, the array substrate 100 includes a lower substrate 110, a driving element 120, an insulating structure 130, the emission element 150, a pixel defining layer 140, and a thin film encapsulation structure 160.

The lower substrate 110 may include a transparent material or an opaque material. The lower substrate 110 may be formed of a transparent resin substrate. An example of the transparent resin substrate that can be used as the lower substrate 110 may be a polyimide substrate. In this case, the polyimide substrate may include a first organic layer, a first barrier layer, a second organic layer, and the like. In another embodiment, the lower substrate 110 may include a quartz substrate, a synthetic quartz substrate, a calcium fluoride substrate, a fluorine-doped quartz substrate, a soda lime glass substrate, an alkali-free glass substrate, and the like. These may be used alone or in combination with each other.

The driving element 120 may be disposed in each of the first, second, and third emission areas LA1, LA2, and LA3 on the lower substrate 110. For example, the active pattern of the driving element-device 120 may include amorphous silicon, polycrystalline silicon, or a metal oxide semiconductor.

The insulating structure 130 may be disposed on the lower substrate 110. The insulating structure 130 may cover the driving element 120. The insulating structure 130 may include a combination of at least one inorganic insulating layer and at least one organic insulating layer. For example, the inorganic insulating layer may include silicon oxide, silicon nitride, silicon carbide, silicon oxynitride, silicon oxycarbide, and the like. The organic insulating layer may include photoresist, polyacryl-based resin, polyimide-based resin, polyamide-based resin, siloxane-based resin, acryl-based resin, epoxy-based resin, and the like. Each of these may be used alone or in combination with each other.

A first electrode 151 may be disposed in each of the first, second, and third emission areas LA1, LA2, and LA3 on the insulating structure 130. The first electrode 151 may be electrically connected to the driving element 120 through a contact hole formed by removing a portion of the insulating structure 130. The first electrode 151 may include a metal, an alloy, a metal nitride, a conductive metal oxide, a transparent conductive material, and the like. These may be used alone or in combination with each other. For example, the first electrode 151 may act as an anode.

The pixel defining layer 140 may be disposed in the light blocking area BA on the insulating structure 130 and the first electrode 151. The pixel defining layer 140 may cover both sides of the first electrode 151 and may expose a portion of an upper surface of the first electrode 151. The pixel defining layer 140 may include an organic material or an inorganic material. Examples of the organic material that can be used for the pixel defining layer 140 may be photoresist, polyacrylic resin, polyimide-based resin, polyamide-based resin, siloxane-based resin, acrylic-based resin, epoxy-based resin, and the like. These may be used alone or in combination with each other.

An organic emission layer 152 may be disposed on the first electrode 151. Holes provided from the first electrode 151 and electrons provided from a second electrode 153 combine in the organic emission layer 152 to form an exciton, and as the exciton changes from an excited state to a ground state, the organic emission layer 152 may emit light. For example, the organic emission layer 152 may emit at least one of red light, green light, and blue light. In an embodiment, the organic emission layer 152 may emit blue light.

The second electrode 153 may be disposed on the organic emission layer 152 and the pixel defining layer 140. The second electrode 153 may include a metal, an alloy, a metal nitride, a conductive metal oxide, a transparent conductive material, and the like. These may be used alone or in combination with each other. For example, the second electrode 153 may act as a cathode.

Accordingly, the emission element 150 including the first electrode 151, the organic emission layer 152, and the second electrode 153 may be disposed on the lower substrate 110. The emission element 150 may provide light to the color conversion substrate 200.

The thin film encapsulation structure 160 may be disposed on the second electrode 153. The thin film encapsulation structure 160 may prevent impurities, moisture, etc. from penetrating into the emission element 150 from the outside. The thin film encapsulation structure 160 may include at least one inorganic encapsulation layer and at least one organic encapsulation layer. For example, the inorganic encapsulation layer may include silicon oxide, silicon nitride, silicon oxynitride, and the like. The organic encapsulation layer may include a cured polymer such as polyacrylate.

The filling layer 300 may be disposed between the color conversion substrate 200 and the array substrate 100. The filling layer 300 may include a material capable of transmitting light. The filling layer 300 may be disposed to maintain a filling gap between the color conversion substrate 200 and the array substrate 100. For example, the filling layer 300 may include an organic material. In another embodiment, the filling layer 300 may be omitted.

As described above, the display device 1000 according to an embodiment may have a structure in which the color conversion substrate 200 including the color conversion layer 260 and the array substrate 100 including the emission element 150 are coupled. However, the embodiments described herein are not limited thereto, and the display device 1000 may a structure in which the array substrate 100 including the emission element 150 and the color conversion layer 260 disposed on the array substrate 100 are sequentially stacked.

Figure 6:
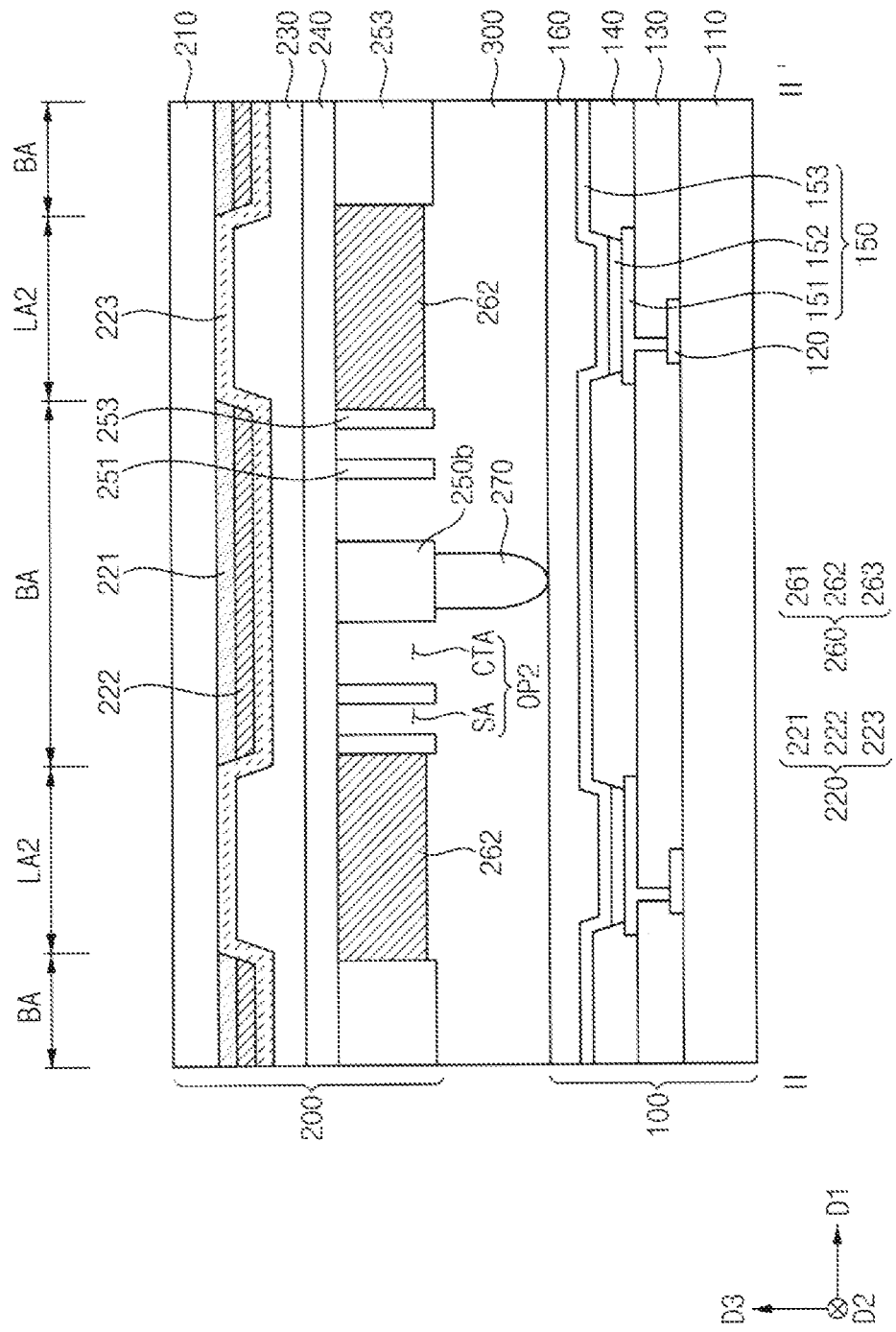
FIG. 6 is a cross-sectional view taken along line II-II' of FIGS. 3 and 4.
Figure 7:
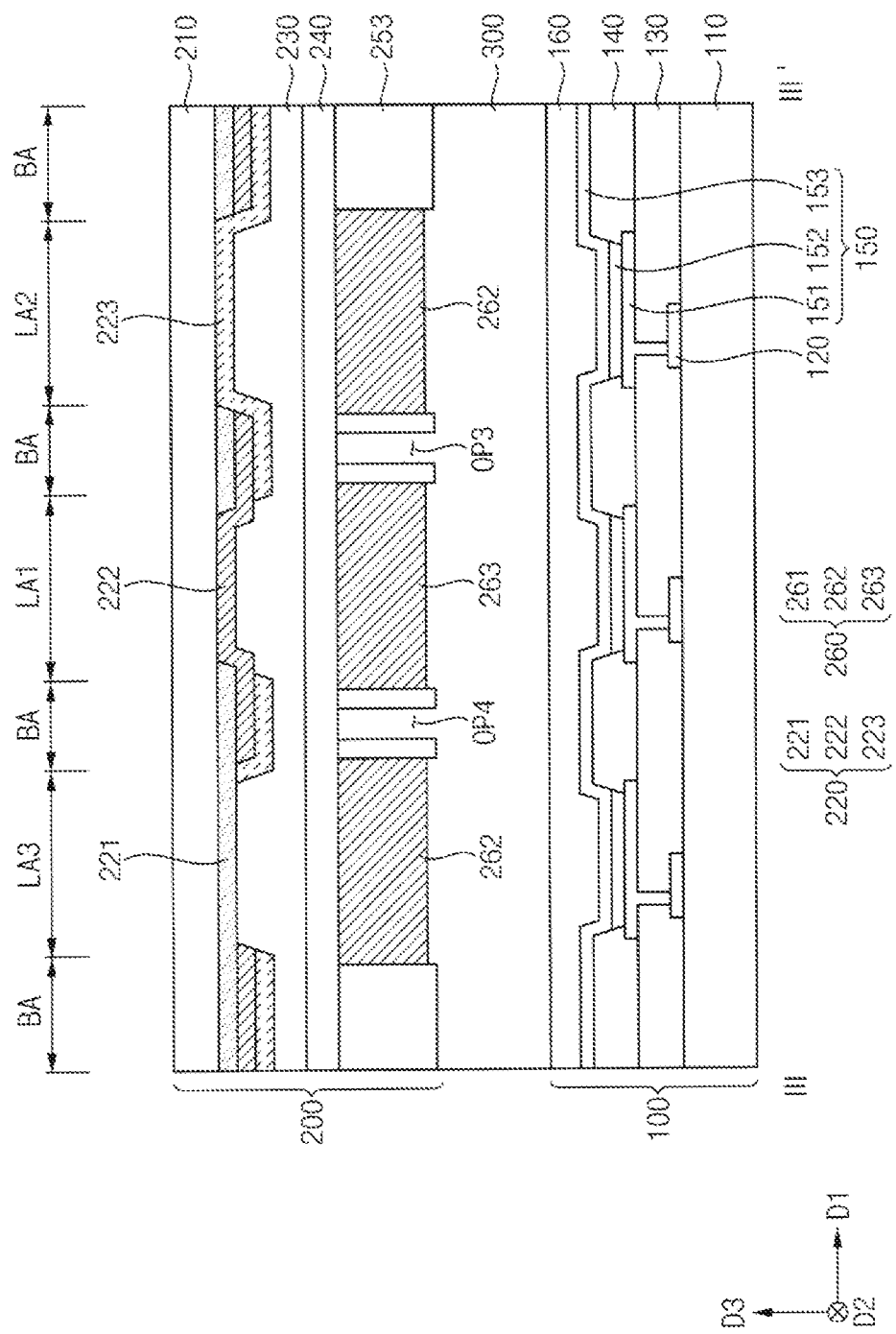
FIG. 7 is a cross-sectional view taken along line III-III' of FIGS. 3 and 4.
Figure 8:
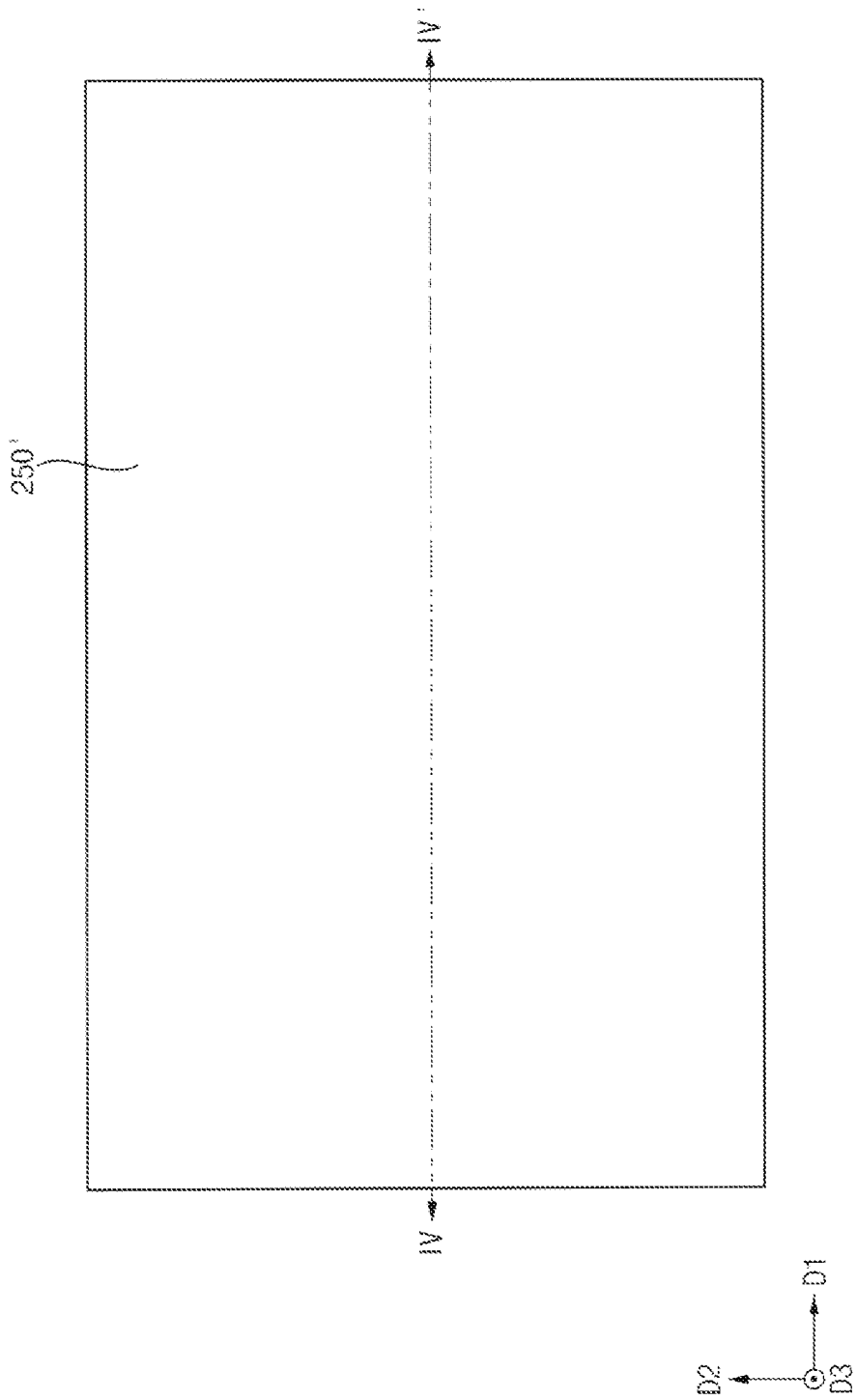
FIGS. 8, 9, 10, 11, 12, 13, 14, 15, and 16 are diagrams illustrating a method of manufacturing the color conversion substrate of FIGS. 6 and 7.
Figure 9:
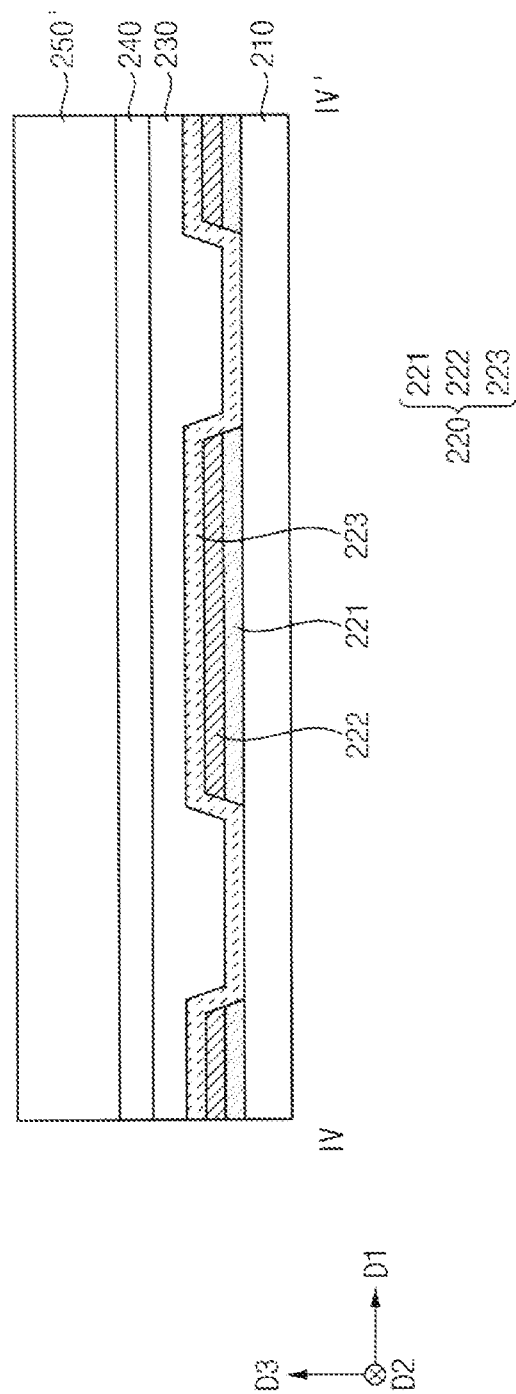
Figure 10:
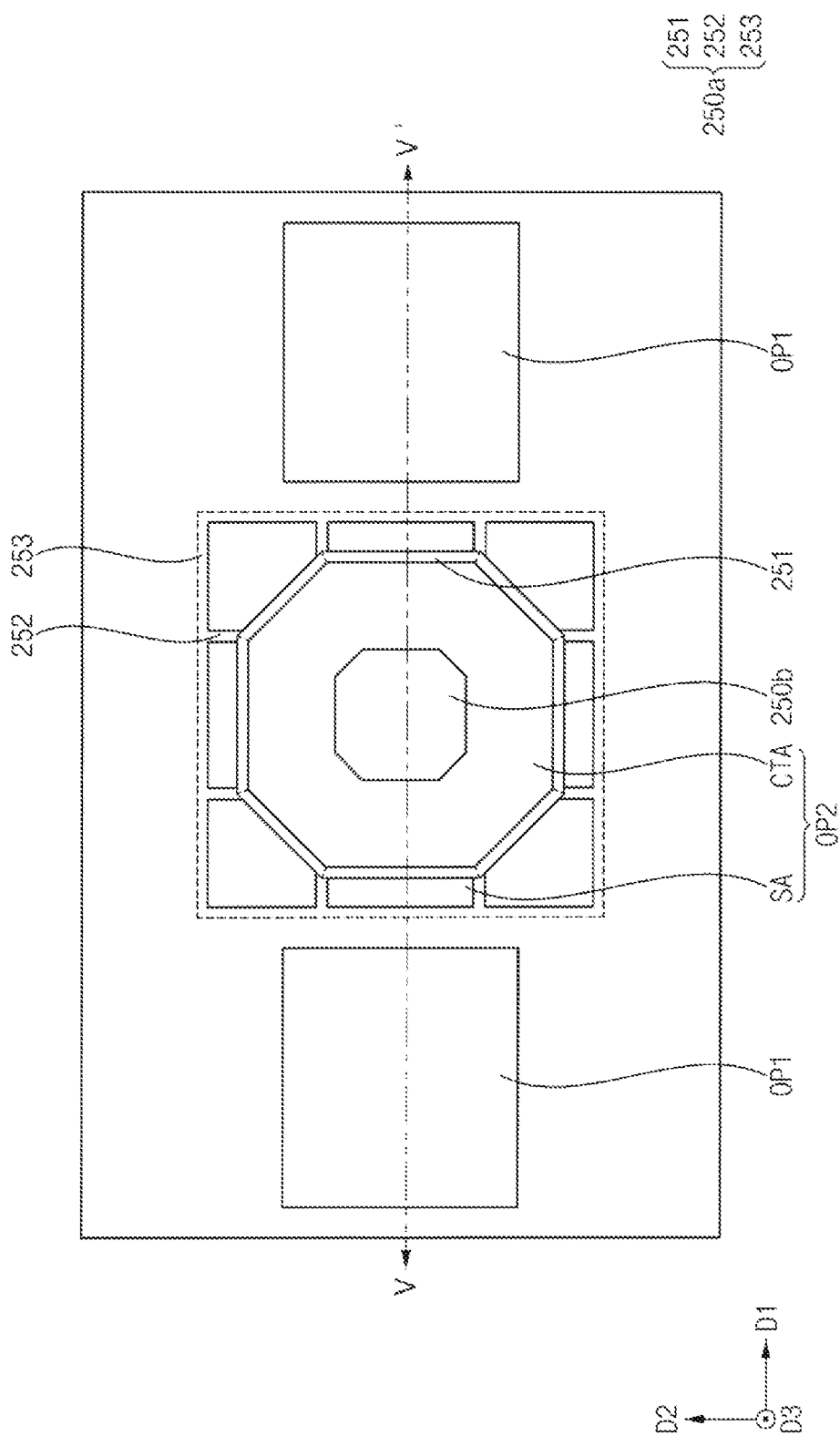
Figure 11:
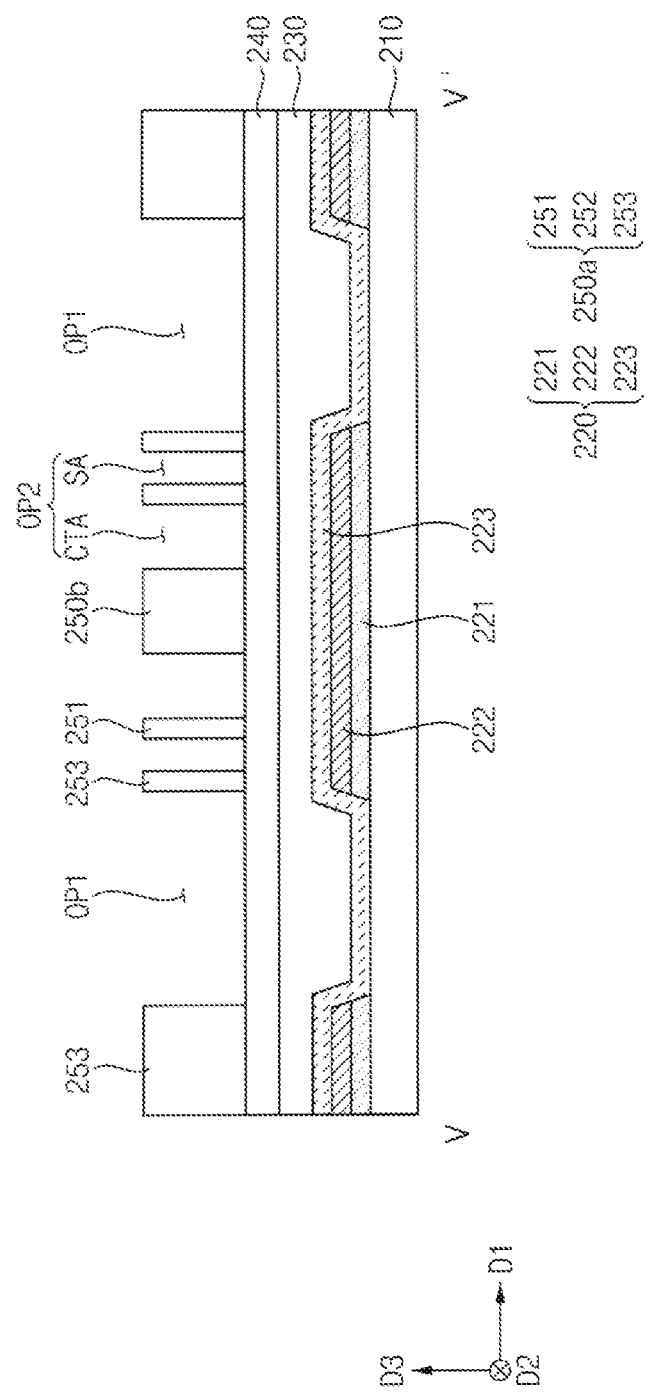
Figure 12:
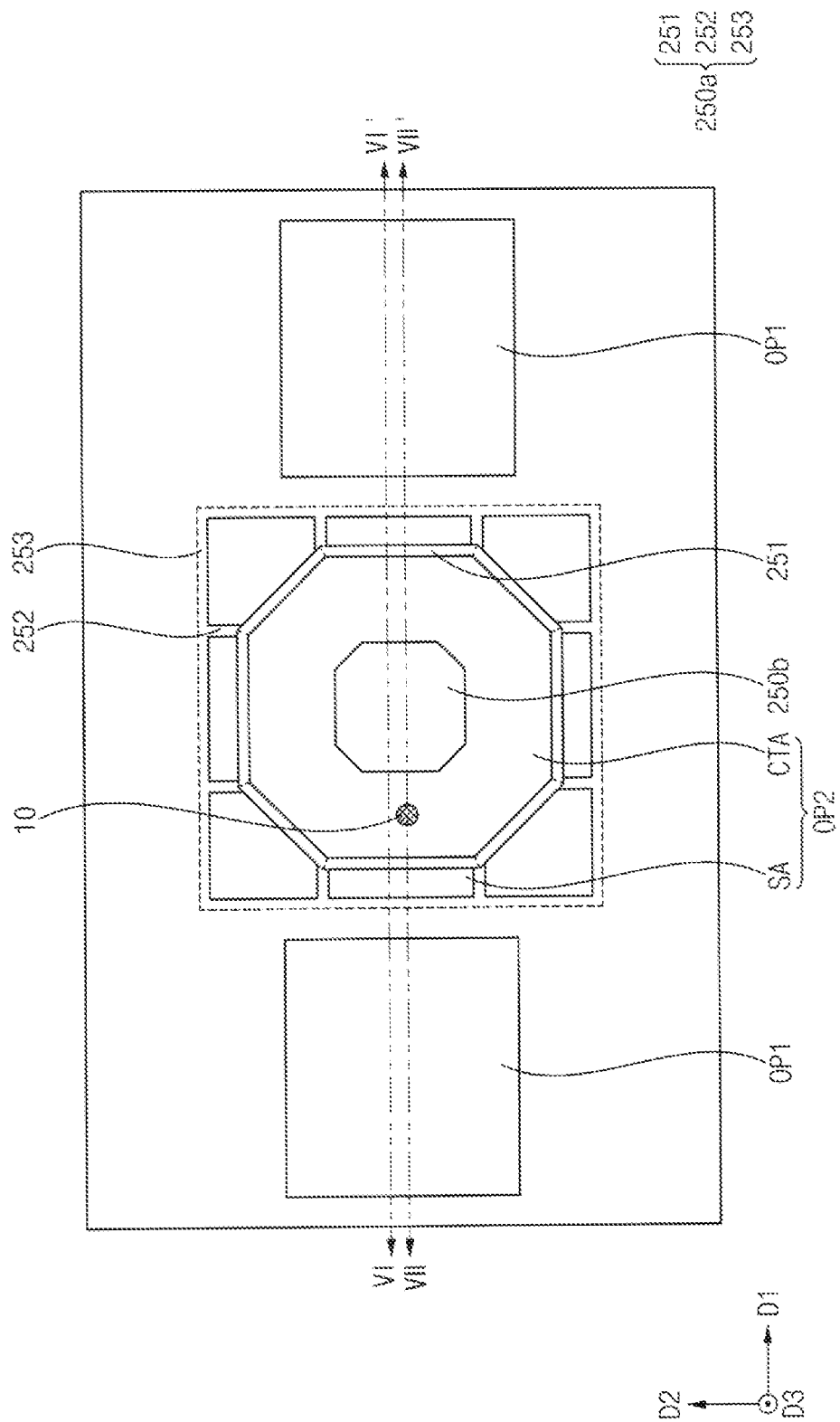
Figure 13:
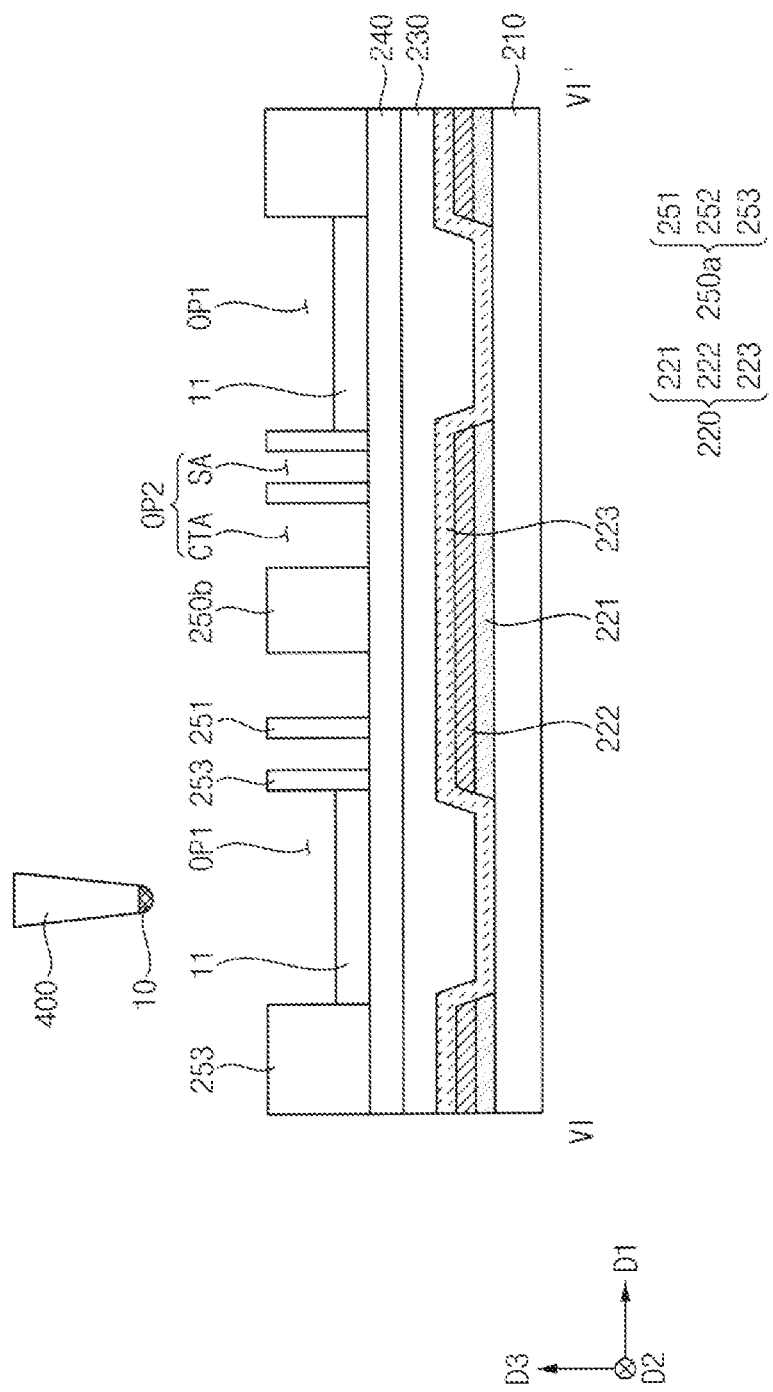
Figure 14:
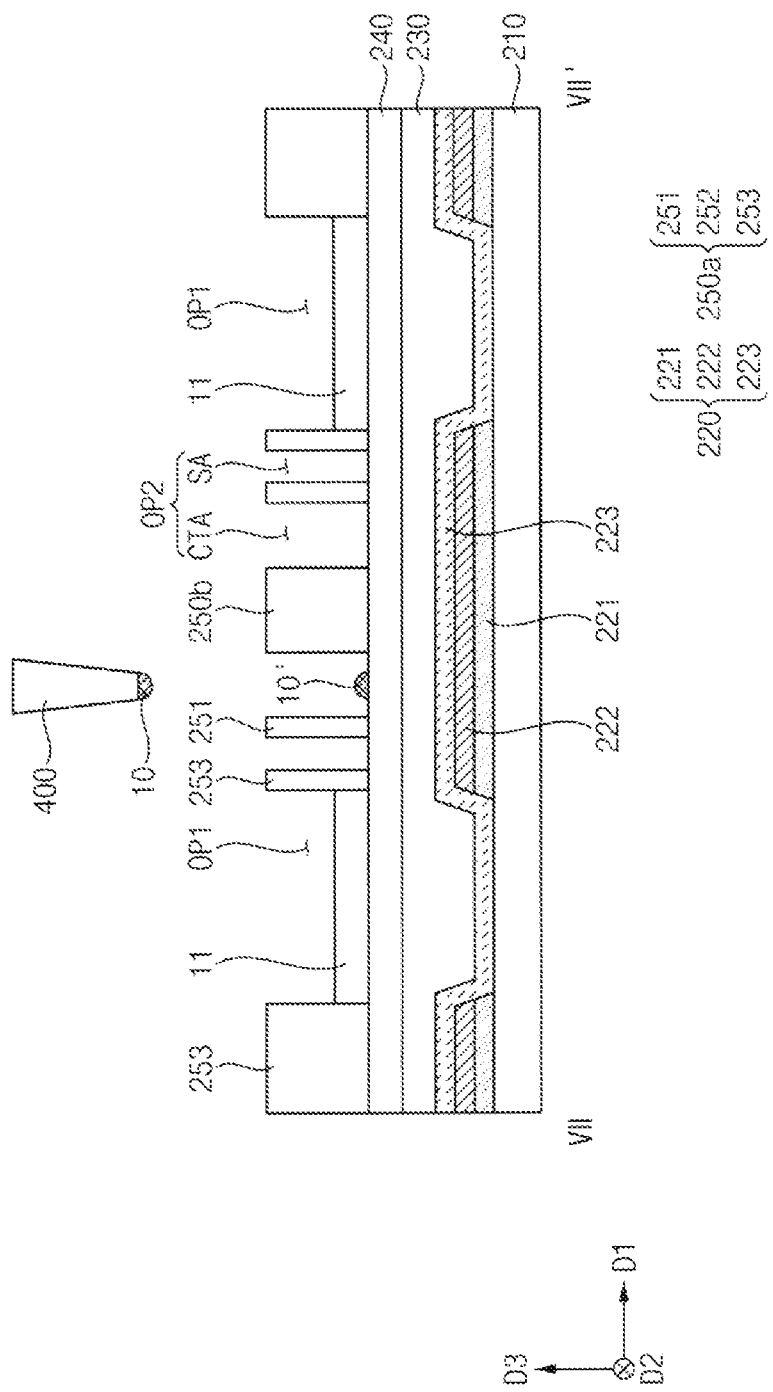
Figure 15:
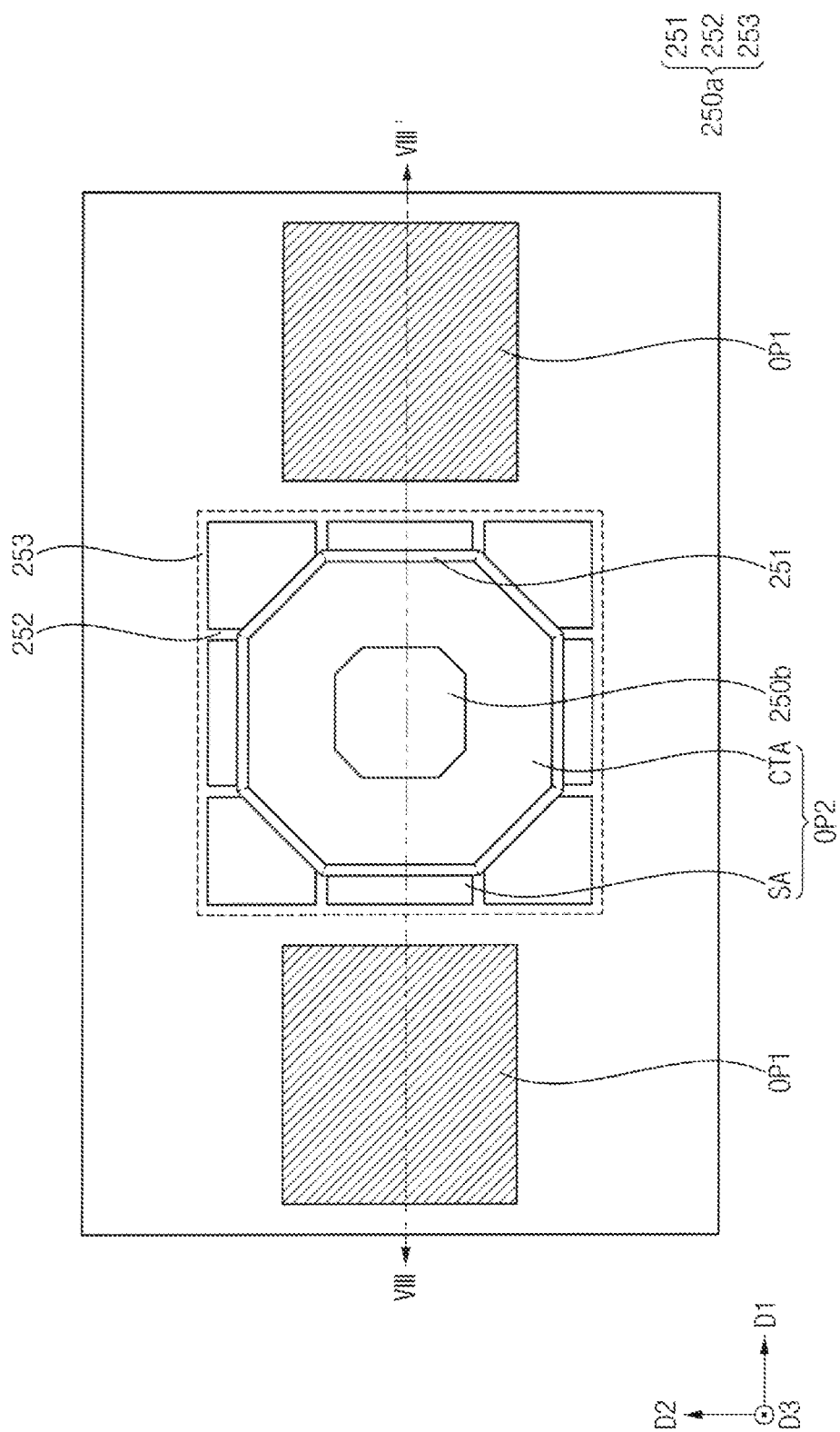
Figure 16:
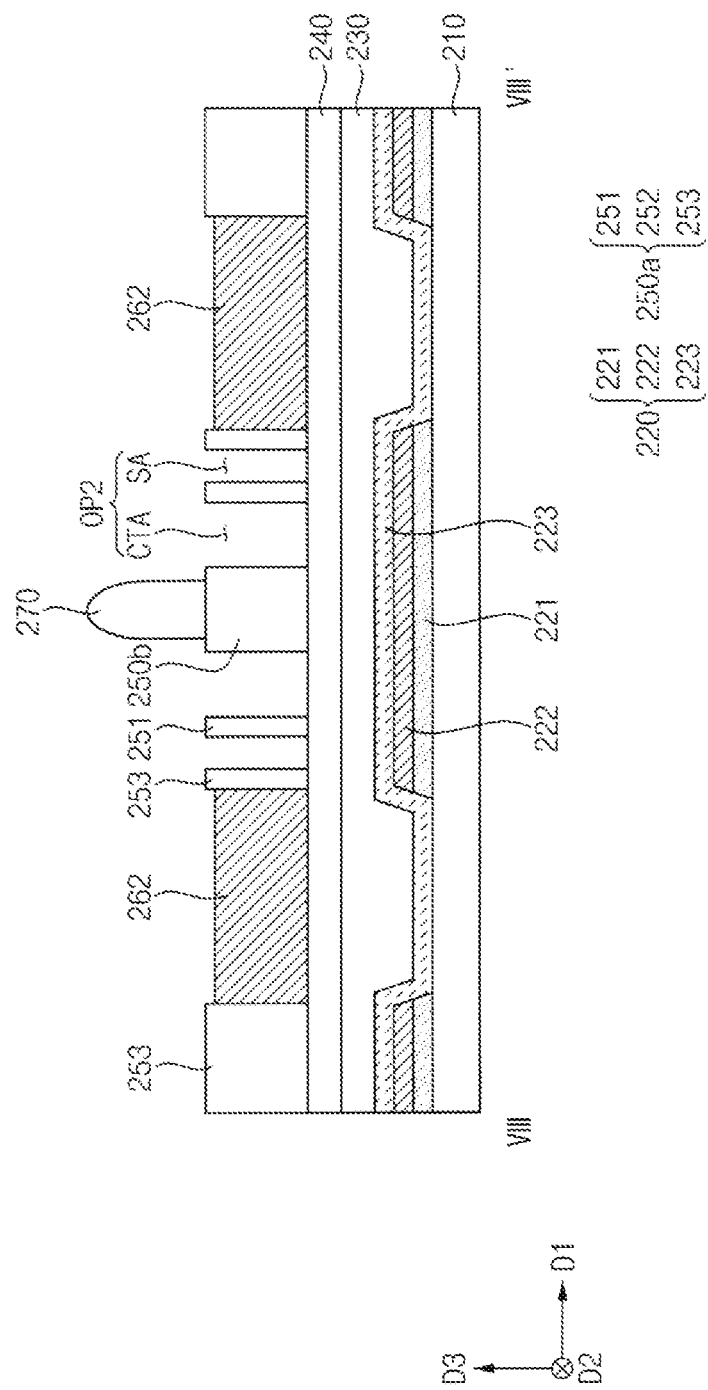

FIGS. 8, 9, 10, 11, 12, 13, 14, 15, and 16 are diagrams illustrating a method of manufacturing the color conversion substrate of FIGS. 6 and 7. For example, FIG. 9 is a cross-sectional view taken along line IV-IV' of FIG. 8. FIG. 11 is a cross-sectional view taken along line V-V' of FIG. 10. FIG. 13 is a cross-sectional view taken along line VI-VI' of FIG. 12. FIG. 14 is a cross-sectional view taken along line VII-VII' of FIG. 12. FIG. 16 is a cross-sectional view taken along line VIII-VIII' of FIG. 15.

Referring to FIGS. 8 and 9, the color filter layer 220 may be formed on the upper substrate 210. The color filter layer 220 may include the first, second, and third color filter layers 221, 222, and 223. In the process of forming the color filter layer 220, the first, second, and third color filter layers 221, 222, and 223 may be stacked to overlap the light blocking area BA.

The first color filter layer 221 may selectively transmit red light, the second color filter layer 222 may selectively transmit green light, and the third color filter layer 223 may selectively transmit blue light.

The low refractive index layer 230 may be formed on the color filter layer 220. The low refractive index layer 230 may be formed using an organic material. For example, the low refractive index layer 230 may be formed using an organic polymer material including silicon.

The protective layer 240 may be formed on the low refractive index layer 230. The protective layer 240 may be formed using an inorganic material. For example, the protective layer 240 may be formed using silicon oxide, silicon nitride, aluminum nitride, and the like.

A preliminary bank 250' may be formed on the protective layer 240. That is, a material forming the preliminary bank 250' may be entirely coated on the protective layer 240.

Referring to FIGS. 10 and 11, the first bank structure 250a and the second bank structure 250b may be formed by etching the preliminary bank 250'. The first bank structure 250a may include the first, second, and third partition walls 251, 252, and 253.

As the first bank structure 250a is formed, the first bank structure 250a may have the first opening area OP1 and the second opening area OP2. The first partition wall 251 may divide the second opening area OP2 into the central area CTA and the peripheral area SA surrounding the central area CTA. The second partition walls 252 may divide the central area CTA into a plurality of sub areas. The third partition wall 253 may denote a portion other than the first partition wall 251 and the second partition walls 252.

The second bank structure 250b may be formed in the central area CTA of the second opening area OP2 to be spaced apart from the first partition wall 251. Specifically, the central portion of the second bank structure 250b may coincide with the central portion of the central area CTA. The second bank structure 250b may be separated from the first bank structure 250a. That is, the second bank structure 250b may not be connected to the first bank structure 250a.

Referring to FIGS. 12, 13, and 14, an inkjet apparatus 400 may apply an ink 10 into the first opening area OP1. Here, the ink 10 may be a material forming the color conversion layer 260. In this case, an ink layer 11 used for manufacturing the second color conversion layer 262 may be formed in the first opening area OP1 on the protective layer 240.

The inkjet apparatus 400 may apply the ink 10 also into the second opening area OP2. The ink 10 that is applied into the second opening area OP2 may be referred to as an ink that is erroneous applied. The second bank structure 250b may be formed in the central portion of the central area CTA that is farthest from the first opening area OP1. Accordingly, applying of the ink that is erroneous applied on the second bank structure 250b may be prevented or reduced. The second opening area OP2 may accommodate the ink that is erroneous applied. In this case, a protrusion may not be formed on the second bank structure 250b.

Referring to FIGS. 14, 15, and 16, the inkjet apparatus 400 may repeatedly apply the ink 10 into the first opening area OP1 to form the second color conversion layer 262. Referring back to FIGS. 4 and 7, the inkjet apparatus 400 may repeatedly apply the ink 10 into the first opening area OP1 to form the first color conversion layer 261 and the transmission layer 263.

The spacer 270 may be formed on the second bank structure 250b. For example, the spacer 270 may be formed using an organic material.

Accordingly, the color conversion substrate 200 shown in FIGS. 1 and 2 may be manufactured.

Figure 17:
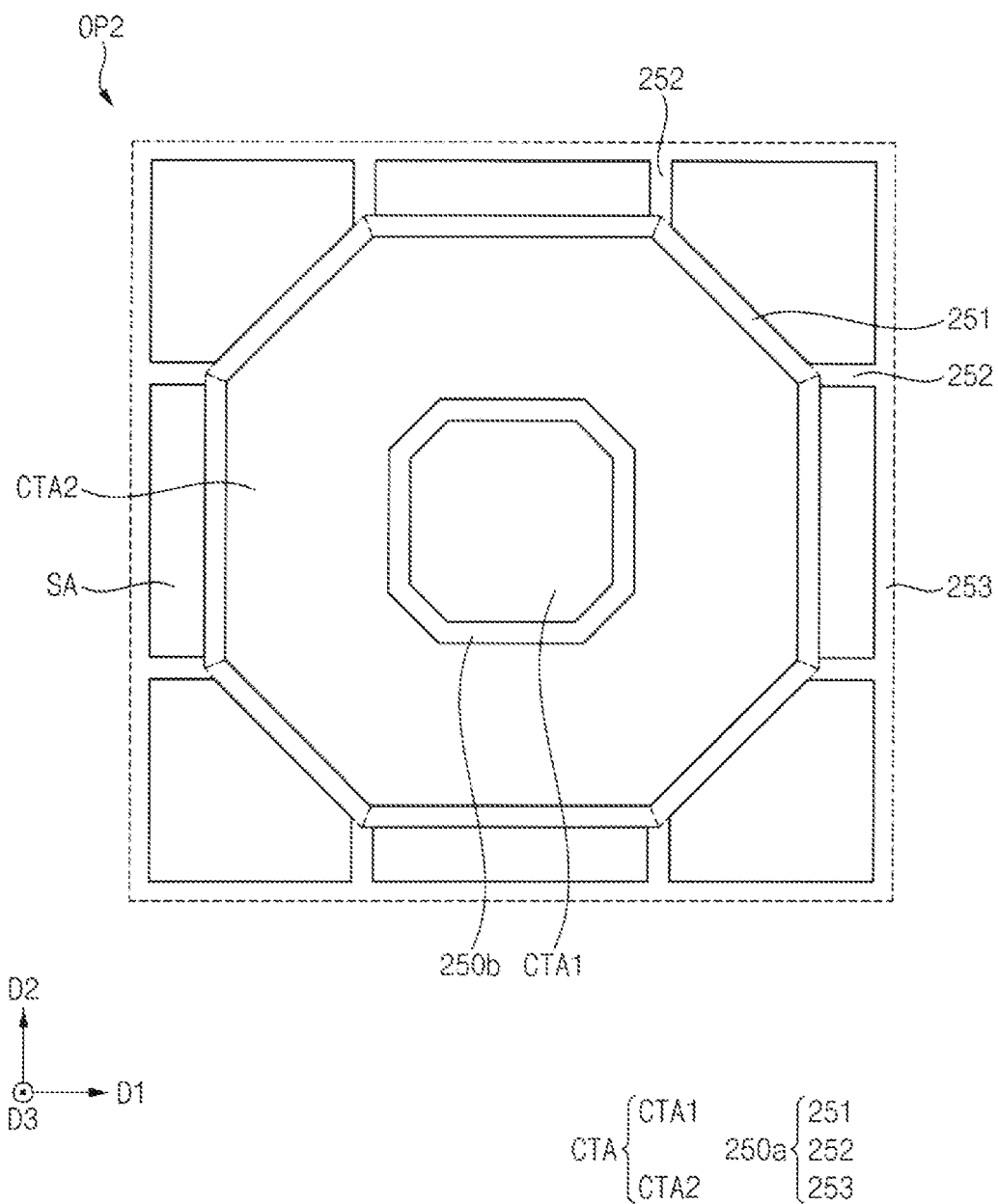
FIGS. 17 and 18 are diagrams illustrating a color conversion substrate according to another embodiment.
Figure 18:
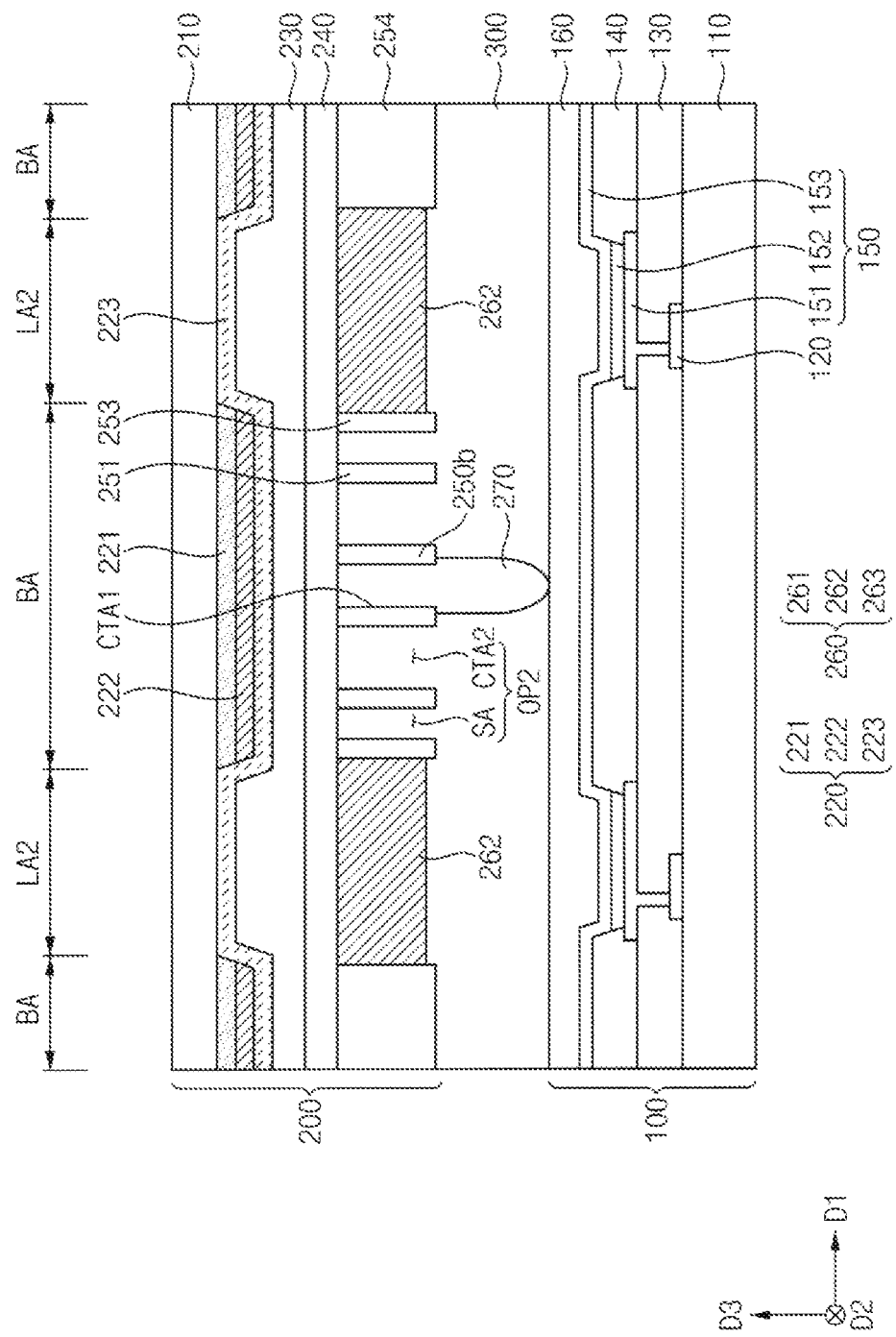

FIGS. 17 and 18 are diagrams illustrating a color conversion substrate according to another embodiment.

The second opening area OP2 of the first bank structure 250a shown in FIG. 17 may be substantially the same as or similar to the second opening area OP2 of the first bank structure 250a described with reference to FIG. 5 except for the second bank structure 250b. In addition, the color conversion substrate 200 shown in FIG. 18 may be substantially the same as or similar to the color conversion substrate 200 described with reference to FIG. 6 except for the second bank structure 250b. Hereinafter, overlapping descriptions will be omitted for ease in explanation of this figure.

Referring to FIGS. 17 and 18, the color conversion substrate 200 may include the upper substrate 210, the color filter layer 220, the low refractive index layer 230, the protective layer 240, the color conversion layer 260, the first bank structure 250a, the second bank structure 250b, and the spacer 270.

The first bank structure 250a may have the first opening area OP1 and the second opening area OP2. The second opening area OP2 may include the central area CTA and the peripheral area SA surrounding the central area CTA.

The second bank structure 250b may be disposed in the central area CTA of the second opening area OP2 to be spaced apart from the first partition wall 251. In an embodiment, the second bank structure 250b may divide the central area CTA into a first central area CTA1 and a second central area CTA2. The second central area CTA2 may surround the first central area CTA1.

Ink applied from the inkjet apparatus (e.g., the inkjet apparatus 400 shown in FIG. 13) on the second bank structure 250b may be erroneously applied. In this case, the first central area CTA1 may accommodate the ink.

The spacer 270 may be disposed on a lower surface of the second bank structure 250b. Specifically, the spacer 270 may be disposed on the lower surface of the second bank structure 250b to overlap the first central area CTA1. In this case, the spacer 270 may fill the first central area CTA1.

Figure 19:
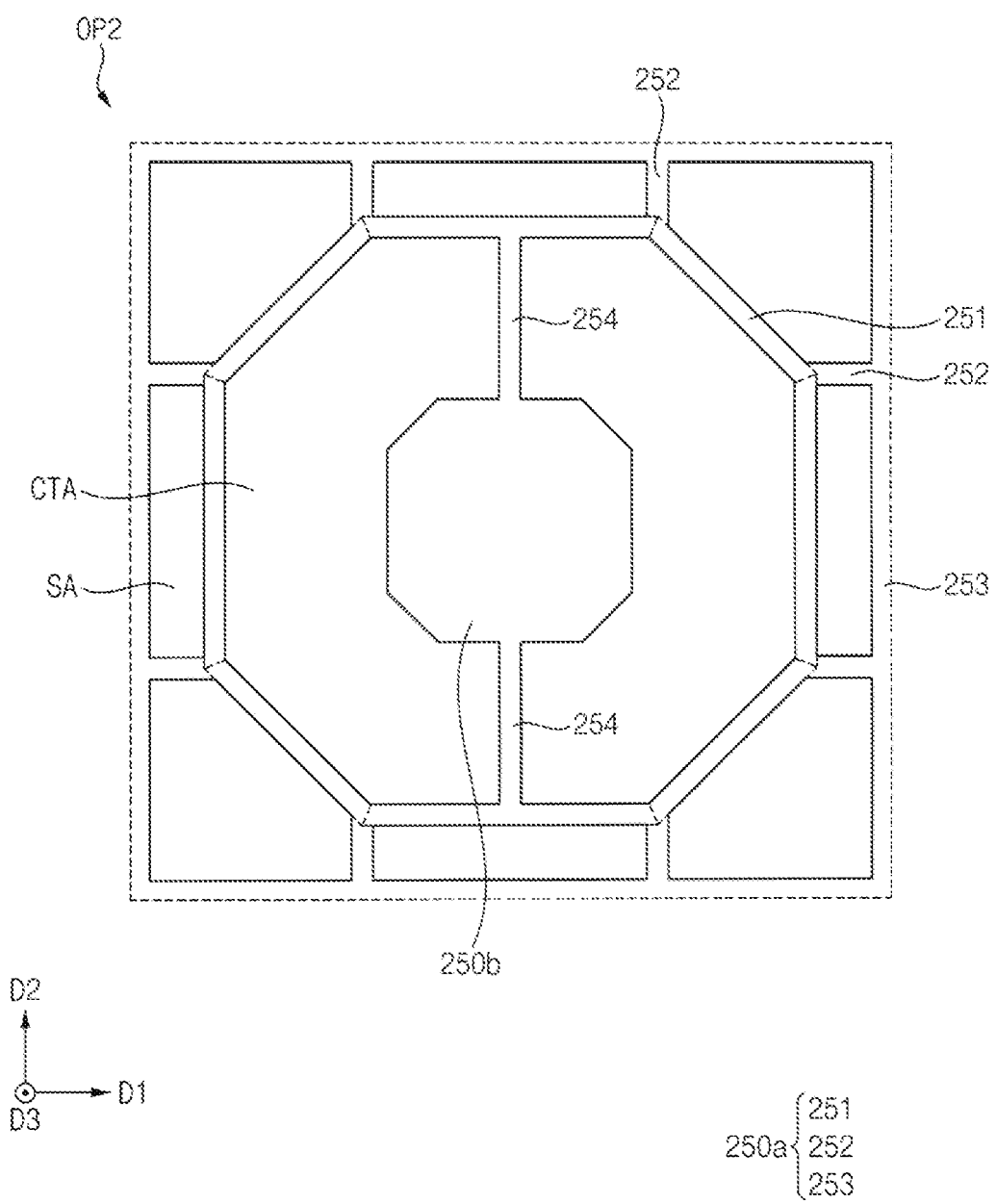
FIG. 19 is a plan view illustrating a second opening area in a color conversion substrate according to still another embodiment.

FIG. 19 is a plan view illustrating a second opening area in a color conversion substrate according to still another embodiment.

The second opening area OP2 of the first bank structure 250a shown in FIG. 19 may be substantially the same as or similar to the second opening area OP2 described with reference to FIG. 5 except for a connection pattern 254. Hereinafter, overlapping descriptions will be omitted for ease in explanation of this figure.

Referring to FIGS. 6 and 19, the color conversion substrate 200 may include the upper substrate 210, the color filter layer 220, the low refractive index layer 230, the protective layer 240, the color conversion layer 260, the first bank structure 250a, the second bank structure 250b, the connection pattern 254, and the spacer 270.

In an embodiment, the connection pattern 254 may connect the first bank structure 250a and the second bank structure 250b. Specifically, the connection pattern 254 may connect the first partition wall 251 of the first bank structure 250a and the second bank structure 250b. The connection pattern 254 may prevent the second bank structure 250b from being lost.

The connection pattern 254 may be integrally formed with the first bank structure 250a and the second bank structure 250b. Specifically, the connection pattern 254 may be integrally formed with the first partition wall 251 and the second bank structure 250b of the first bank structure 250a. That is, the connection pattern 254 may be simultaneously formed using the same material as the first bank structure 250a and the second bank structure 250b.

In an embodiment, the connection pattern 254 may have a length extending in the second direction D2. In another embodiment, the connection pattern 254 has a length extending in the first direction D1 orthogonal to the second direction D2 or a length extending in a specific direction intersecting each of the first and second directions D1 and D2.

Figure 20:
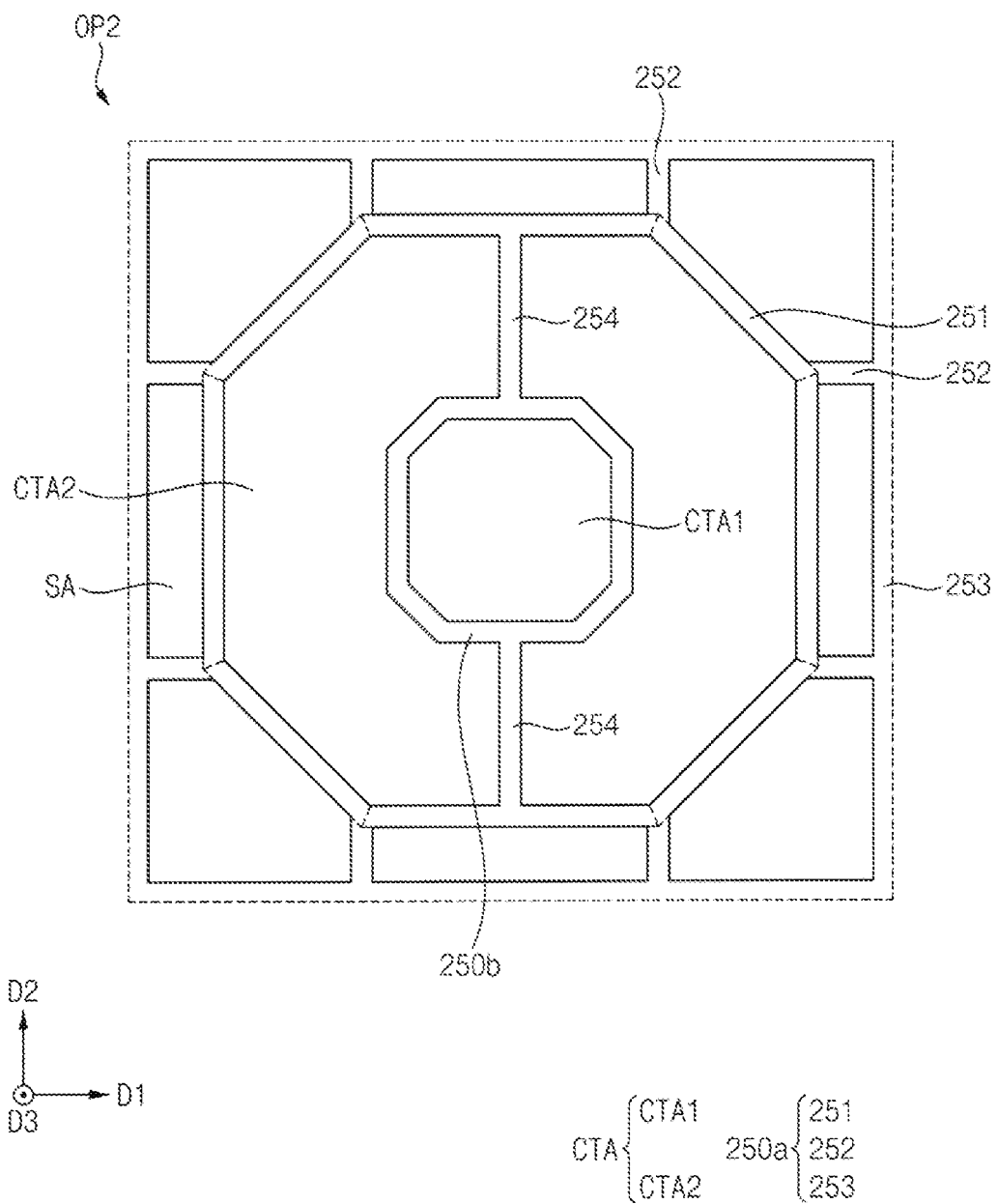
FIG. 20 is a plan view illustrating a second opening area in a color conversion substrate according to still another embodiment.

The second opening area OP2 of the first bank structure 250a shown in FIG. 20 may be substantially the same as or similar to the second opening area OP2 described with reference to FIG. 5 except for the second bank structure 250b and the connection pattern 254. Hereinafter, overlapping descriptions will be omitted for ease in explanation of this figure.

Referring to FIGS. 17, 18, 19 and 20, the color conversion substrate 200 may include the upper substrate 210, the color filter layer 220, the low refractive index layer 230, the protective layer 240, the color conversion layer 260, the first bank structure 250a, the second bank structure 250b, the connection pattern 254, and the spacer 270.

The first bank structure 250a may have the first opening area OP1 and the second opening area OP2. The second opening area OP2 may include the central area CTA and the peripheral area SA surrounding the central area CTA.

The second bank structure 250b may be disposed in the central area CTA of the second opening area OP2 to be spaced apart from the first partition wall 251. In an embodiment, the second bank structure 250b may divide the central area CTA into the first central area CTA1 and the second central area CTA2. The second central area CTA2 may surround the first central area CTA1.

In an embodiment, the connection pattern 254 may connect the first partition wall 251 of the first bank structure 250a and the second bank structure 250b. The connection pattern 254 may be integrally formed with the first partition wall 251 of the first bank structure 250a and the second bank structure 250b.

The embodiments described hereinabove can be applied to various display devices that may include a display device. For example, the embodiments described hereinabove can be applied to high-resolution smartphones, mobile phones, smart pads, smart watches, tablet PCs, in-vehicle navigation systems, televisions, computer monitors, notebook computers, and the like.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A color conversion substrate comprising:
    a first bank structure including a first partition wall respectively enclosing a first opening area and a second opening area in a plan view, the second opening area being spaced apart from the first opening area by the first partition wall, the first partition wall dividing the second opening area into a central opening area and a peripheral opening area spaced apart from and surrounding the central opening area in the plan view;
    a second bank structure spaced apart from the first partition wall in the plan view, the second bank structure being disposed in the central opening area of the second opening area;
    a spacer disposed in correspondence with the second bank structure, the second bank structure overlapping the spacer in the plan view; and
    a color conversion layer disposed in the first opening area, the color conversion layer including, a color converting particle.

2. The color conversion substrate of claim 1, wherein, in the plan view, the first partition wall has a shape of a polygon that includes a plurality of vertices.

3. The color conversion substrate of claim 2, wherein the polygon is any one of a quadrangle, a hexagon, and an octagon.

4. The color conversion substrate of claim 1, wherein a central portion of the second bank structure coincides with a central portion of the central opening area.

5. The color conversion substrate of claim 1, wherein an area of the second opening area in a plane orthogonal to the first bank structure is larger than an area of the first opening area in the plane.

6. The color conversion substrate of claim 1, wherein the second bank structure divides the central opening area into a first central opening area and a second central opening area surrounding the first central opening area in the plan view.

7. The color conversion substrate of claim 6, wherein the spacer overlaps the first central area in the plan view.

8. The color conversion substrate of claim 1, further comprising:
    a connection pattern connecting the first bank structure and the second bank structure to each other.

9. The color conversion substrate of claim 8, wherein
    the connection pattern connects the first partition wall and the second bank structure to each other, and
    wherein the connection pattern is integral formed with both the first partition wall and the second bank structure.

10. The color conversion substrate of claim 1, further comprising:
    a connection pattern connecting the first bank structure and the second bank structure to each other,
    wherein the second bank structure divides the central opening area into a first central opening area and a second central opening area spaced apart from and surrounding the first central opening area in the plan view.

11. The color conversion substrate of claim 1, wherein
    the first opening area includes a first color conversion area, a second color conversion area, and a third color conversion area, and
    the color conversion layer includes a first color conversion layer, a second color conversion layer, and a third color conversion layer disposed in the first color conversion area, the second color conversion area, and the third color conversion area, respectively.

12. The color conversion substrate of claim 11, wherein
    the first color conversion area and the third color conversion area are repeatedly arranged along a first row,
    the second color conversion area is repeatedly arranged along a second row, and
    the first bank structure further includes:
        a third opening area adjacent to the second color conversion area and extending in a first direction; and a fourth opening area between the first color conversion area and the third color conversion area, the fourth opening area extending in a second direction orthogonal to the first direction.

13. A color conversion substrate comprising:
a first bank structure having a first opening area and a second opening area, and including a first partition wall, the first partition wall dividing the second opening area into a central area and a peripheral area surrounding the central area in a plan view;
a second bank structure spaced apart from the first partition wall, the second bank structure being disposed in the central area of the second opening area;
a spacer overlapping the second bank structure; and
a color conversion layer disposed in the first opening area, the color conversion layer including a color converting particle,
wherein the first bank structure further includes a plurality of second partition walls that extend from the first partition wall to an edge of the second opening area, the plurality of second partition walls dividing the peripheral area into a plurality of sub areas.

14. The color conversion substrate of claim 13, wherein each of the plurality of second partition walls is perpendicular to the edge of the second opening area.

15. The color conversion substrate of claim 13, wherein the first bank structure and the second bank structure include a same material.

16. A display device comprising:
a first bank structure having a first opening area in a light emitting area of the display device and a second opening area corresponding to a light blocking area of the display device, and including a first partition wall, the first partition wall dividing the second opening area into a central area and a peripheral area surrounding the central area in a plan view;
a second bank structure spaced apart from the first partition wall in the plan view, the second bank structure being disposed in the central area of the second opening area;
a spacer disposed in correspondence with the second bank structure, the second bank structure overlapping the spacer in the plan view;
a color conversion layer disposed in the first opening area, the color conversion layer including a color converting particle; and
a light emission element disposed under the color conversion layer, the first opening area overlapping the light emission element in the plan view.

17. The display device of claim 16, wherein the first bank structure further includes: a plurality of second partition walls extending from the first partition wall to an edge of the second opening area, the plurality of second partition walls dividing the peripheral area into a plurality of sub-peripheral areas.

18. The display device of claim 17, wherein the first bank structure and the second bank structure include a same material.

19. The display device of claim 16, wherein
a central portion of the second bank structure coincides with a central portion of the central area, and
the second opening area does not overlap with any light emission elements in the plan view.

20. The display device of claim 16, wherein
the first opening area includes a first color conversion area, a second color conversion area, and a third color conversion area, and
the color conversion layer includes a first color conversion layer, a second color conversion layer, and a third color conversion layer disposed in the first color conversion area, the second color conversion area, and the third color conversion area, respectively.

21. The display device of claim 20, wherein
the first color conversion area and the third color conversion area are repeatedly arranged along a first row,
the second color conversion area is repeatedly arranged along a second row, and
the first bank structure further includes:
a third opening area adjacent to the second color conversion area, the third opening area extending in a first direction; and
a fourth opening area between the first color conversion area and the third color conversion area, the fourth opening area extending in a second direction orthogonal to the first direction.

* * * * *